United States Patent
Kuo et al.

(10) Patent No.: US 12,519,043 B2
(45) Date of Patent: Jan. 6, 2026

(54) ELECTRONIC PACKAGE INCLUDING LEADFRAME FOR POWER TRANSMISSION

(71) Applicant: Advanced Semiconductor Engineering, Inc., Kaohsiung (TW)

(72) Inventors: Chiung-Ying Kuo, Kaohsiung (TW); Hung-Chun Kuo, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 683 days.

(21) Appl. No.: 17/669,230

(22) Filed: Feb. 10, 2022

(65) Prior Publication Data

US 2023/0253299 A1 Aug. 10, 2023

(51) Int. Cl.
*H01L 23/495* (2006.01)
*H01L 23/00* (2006.01)
*H01L 23/31* (2006.01)
*H01L 23/498* (2006.01)

(52) U.S. Cl.
CPC .... *H01L 23/49575* (2013.01); *H01L 23/3107* (2013.01); *H01L 23/49827* (2013.01); *H01L 24/48* (2013.01); *H01L 2224/48091* (2013.01); *H01L 2224/48177* (2013.01)

(58) Field of Classification Search
CPC ............... H01L 23/3107; H01L 24/48; H01L 2224/48177; H01L 23/49575; H01L 23/49827; H01L 2224/48091; H01L 23/50; H01L 23/4952; H01L 24/08; H01L 24/73; H01L 23/49548; H01L 23/49551; H01L 23/49589; H01L 23/49541; H01L 25/16; H10K 59/8723; H10K 59/8722; H10K 71/00; H10K 59/871
USPC ......................................................... 257/666
See application file for complete search history.

(56) References Cited

U.S. PATENT DOCUMENTS

| | | | |
|---|---|---|---|
| 7,960,213 B2 * | 6/2011 | Yang ................. | H01L 23/49524 438/597 |
| 8,115,285 B2 | 2/2012 | Chen et al. | |
| 8,354,741 B2 * | 1/2013 | Kang ...................... | H01L 24/83 257/676 |
| 9,029,992 B2 * | 5/2015 | Kim ...................... | H01L 23/495 257/667 |
| 9,704,812 B1 * | 7/2017 | Lam ................... | H01L 23/49541 |
| 9,907,186 B1 * | 2/2018 | Chiu ................... | H01L 21/4853 |
| 2008/0111220 A1 * | 5/2008 | Lee ...................... | H01L 23/3121 257/676 |
| 2010/0200973 A1 * | 8/2010 | Schravendeel ......... | H01L 24/49 257/676 |
| 2013/0277815 A1 * | 10/2013 | Lee ........................ | H01L 24/85 257/676 |
| 2015/0237721 A1 * | 8/2015 | Choh ................ | H01L 23/49589 29/25.01 |
| 2017/0025335 A1 * | 1/2017 | Liu ........................ | H01L 24/73 |
| 2017/0301617 A1 * | 10/2017 | Lin ........................ | H05K 1/0204 |
| 2017/0311447 A1 * | 10/2017 | Brazzle ................ | H05K 3/3426 |

(Continued)

*Primary Examiner* — Caleb E Henry
(74) *Attorney, Agent, or Firm* — FOLEY & LARDNER LLP

(57) ABSTRACT

An electronic package is provided. The electronic package includes an electronic component and a leadframe. The electronic component has a passive surface. The leadframe includes a first patterned part under the electronic component and configured to provide a power to the electronic component by the passive surface.

6 Claims, 28 Drawing Sheets

(56) References Cited

U.S. PATENT DOCUMENTS

| | | |
|---|---|---|
| 2018/0061809 A1* | 3/2018 | Chiu ................. H01L 23/49541 |
| 2018/0130723 A1* | 5/2018 | Lin ................... H01L 23/49527 |
| 2018/0190622 A1* | 7/2018 | Lin ..................... H01L 23/4952 |
| 2019/0385775 A1* | 12/2019 | Roth ....................... H01L 24/97 |
| 2020/0266132 A1* | 8/2020 | Cho .................. H01L 23/49568 |
| 2021/0249339 A1* | 8/2021 | Lee ................... H01L 23/49562 |
| 2021/0313935 A1* | 10/2021 | Noori ..................... H03F 1/565 |

* cited by examiner

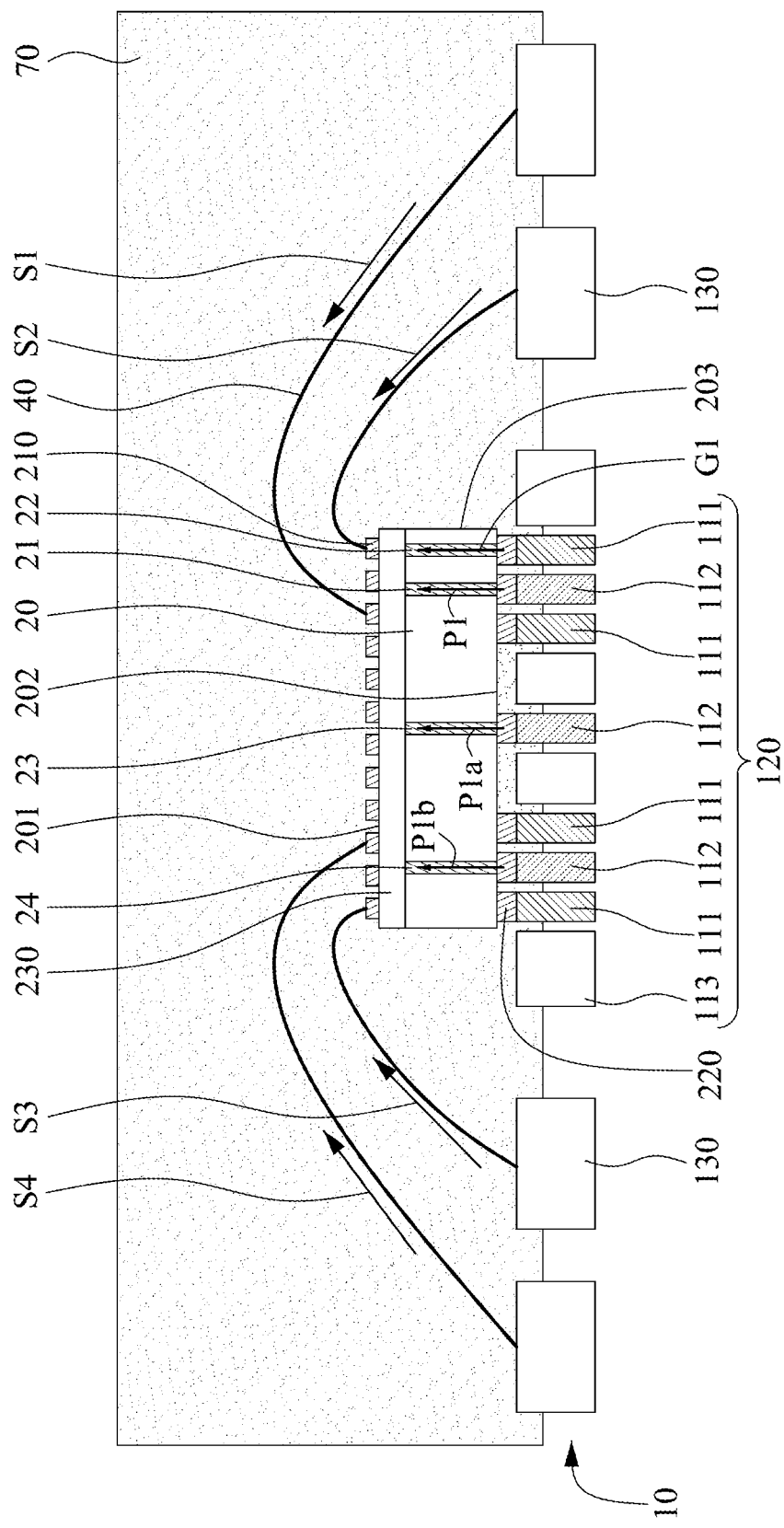

ELECTRONIC PACKAGE INCLUDING LEADFRAME FOR POWER TRANSMISSION

BACKGROUND

1. Technical Field

The present disclosure relates generally to an electronic package.

2. Description of the Related Art

System-in-Package (SiP) technology leverages integrated circuit (IC) assembly capabilities, including wafer level packaging, fan-out wafer level packaging, 2.5D/3D IC, etc., to integrate multiple chips or components into a package.

A power transmission path is usually provided by a substrate and/or package routing features (such as conductive vias, conductive pads, and/or conductive wires) in the package. A long power routing path through the substrate may cause a significant voltage drop and degrade performance thereof. As input voltage decreases, voltage drops may become an issue.

SUMMARY

In some embodiments, an electronic package includes an electronic component and a leadframe. The electronic component has a passive surface. The leadframe includes a first patterned part under the electronic component and configured to provide a power to the electronic component by the passive surface.

In some embodiments, an electronic package includes an electronic component, a power regulating component, and a leadframe. The power regulating component is under the electronic component. The leadframe is disposed below the power regulating component and configured to provide power to the electronic component through the power regulating component.

In some embodiments, an electronic package includes an electronic component and a leadframe. The electronic component has a first surface and a second surface. The leadframe is disposed below the electronic component. The leadframe is configured to provide a first power path to the first surface of the electronic component and a second power path to the second surface of the electronic component.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

FIG. 1A is a cross-section of an electronic package in accordance with some embodiments of the present disclosure.

DETAILED DESCRIPTION

Figure 1B:
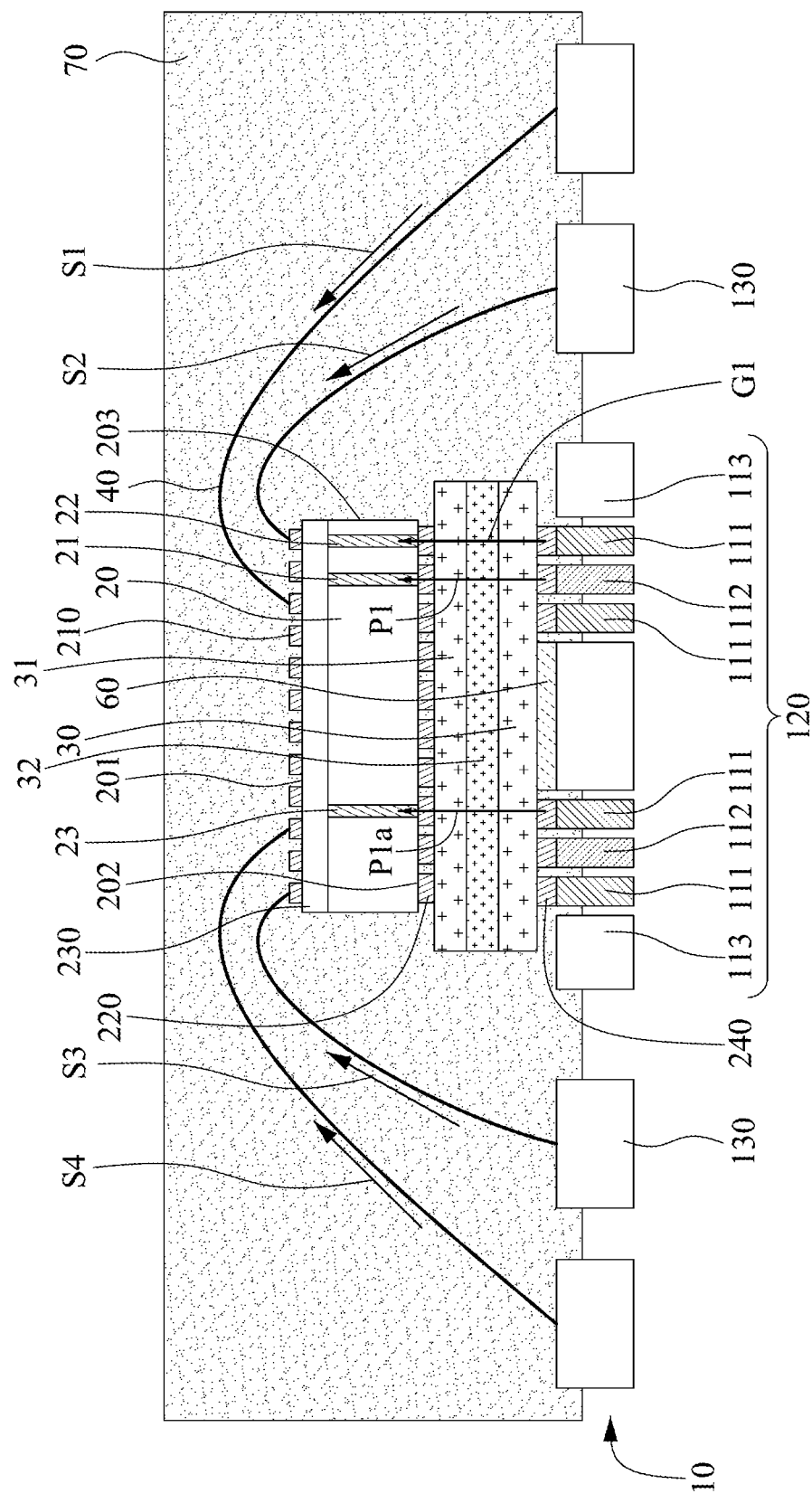
FIG. 1B is a cross-section of an electronic package in accordance with some embodiments of the present disclosure.

FIG. 1A is a cross-section of an electronic package 1A in accordance with some embodiments of the present disclosure. The electronic package 1A includes a leadframe 10, an electronic component 20, conductive elements 40, and a protective element 70.

In some embodiments, the leadframe 10 includes patterned parts 120 and 130. In some embodiments, the patterned part 120 may be referred to as a patterned die pad. In some embodiments, the patterned parts 130 include leads.

The electronic component 20 may have an active surface 201, a passive surface 202 opposite to the active surface 201, and a lateral surface 203 extending between the active surface 201 and the passive surface 202. In some embodiments, the electronic component 20 includes one or more conductive pads 210 on the active surface 201. In some embodiments, a signal (or an electrical signal) may be transmitted through the active surface 201. For example, the electronic component 20 may include an active element 230 (e.g., a circuit region) adjacent to the active surface 201. The active element 230 may be configured to transmit a signal to the leadframe 10 and/or to receive a signal from the leadframe 10. In some embodiments, the leadframe 10 is disposed below the electronic component 20. In some embodiments, the leadframe 10 is configured to provide power to the electronic component 20 by the passive surface 202.

In some embodiments, the electronic component 20 may include one or more conductive vias (e.g., conductive vias 21, 22, 23, and 24) extending between the active surface 201 and the passive surface 202. The conductive vias 21, 22, 23, and 24 may provide electrical connections between the active surface 201 and the passive surface 202 of the electronic component 20. In some embodiments, one or more conductive vias (e.g., the conductive vias 21, 23, and 24) connect the active surface 201 to the passive surface 202 and configure to receive power. In some embodiments, one or more conductive vias (e.g., the conductive via 22) connect the active surface 201 to the passive surface 202 and configure to connect to ground. In some embodiments, the leadframe 10 is disposed below the electronic component 20. In some embodiments, patterned part 120 of the leadframe 10 is disposed under the electronic component 20. In some embodiments, the patterned part 120 of the leadframe 10 is adjacent to the passive surface 202 of the electronic component 20. In some embodiments, the passive surface 202 is closer to the patterned part 120 of the leadframe 10 than the active surface 201.

In some embodiments, the electronic component 20 may be a circuit or a circuit element that relies on an external power supply to control or modify electrical signals. For example, the electronic component 20 may include a processor, a controller, a memory, or an input/output (I/O) buffer, etc. In some embodiments, the electronic component 20 may include, for example, a central processing unit (CPU), a microprocessor unit (MPU), a graphics processing unit (GPU), a microcontroller unit (MCU), an application-specific integrated circuit (ASIC), a field-programmable gate array (FPGA), or another type of integrated circuit.

In some embodiments, the patterned part 120 is configured to provide one or more electrical paths (e.g., paths P1, P1a, P1b, and G1) to the electronic component 20. In some embodiments, the electrical paths are different from each other. In some embodiments, the patterned part 120 is configured to provide one or more power paths (e.g., the paths P1, P1a, and P1b) and one or more non-power paths (e.g., the path G1) to the electronic component 20. In some embodiments, the patterned part 120 is configured to provide a power path P1 and a ground path G1 to the electronic component 20. In some embodiments, the patterned part 120 is configured to further provide a power path P1a and a power path P1b to the electronic component 20. In some embodiments, the power path P1, the power path P1a, and the power path P1b transmit different power voltages. In some embodiments, the patterned part 120 and the electronic component 20 overlap from a top view perspective.

As used herein, an electrical path may refer to a signal path, a power path, or a ground path. For example, a signal path may refer to a path through which an electrical signal may be transmitted. Such an electrical signal may include either analog or digital signals. Additionally, a power path, as used and described herein, may refer to a path dedicated to power supply connections. Moreover, for example, a ground path may refer to a path connected to ground.

In some embodiments, the patterned part 120 includes a plurality of portions 111, 112, and 113. In some embodiments, the portions 111, 112, and 113 are conductive pads. In some embodiments, the portions 111 and the portions 112 are alternatingly arranged. In some embodiments, the portion 111 and the portion 112 are spaced apart from each other. In some embodiments, the portion 111 and the portion 112 are physically spaced apart from each other from a top view perspective. In some embodiments, the portions 111 support the electronic component 20. In some embodiments, the portion 111 is configured to connect to ground. In some embodiments, the portion 111 is configured to provide the ground path G1 to the electronic component 20. In some embodiments, the portion 112 is configured to transmit a power voltage to the electronic component 20. In some embodiments, the portions 112 are configured to transmit power. In some embodiments, the portions 112 are connected to one or more power voltages. In some embodiments, the portions 112 are configured to transmit at least two different power voltages to the electronic component 20. In some embodiments, the portions 111 which connect to ground are disposed at peripheral regions with respect to the portions 112 which transmit power. In some embodiments, the portions 111 are around the portions 112. In some embodiments, the portions 111 surround or partially surround the portions 112. In some embodiments, at least one of the conductive vias of the electronic component 20 is electrically connected to at least one of the portions 111 and 112. In some embodiments, the conductive via 22 is electrically connected to the portion 111, and the conductive vias 21, 23, and 24 are electrically connected to different ones of the portions 112. In some embodiments, these portions 112 are connected to different power voltages.

In some embodiments, the patterned parts 130 are physically spaced apart from the patterned part 120. In some embodiments, the patterned parts 130 are electrically connected to the active surface 201 of the electronic component 20. In some embodiments, the patterned parts 130 of the leadframe 10 are configured to provide one or more non-power paths (e.g., paths S1, S2, S3, and S4) to the electronic component 20. In some other embodiments, one or some of the paths S1, S2, S3, and S4 may be configured to provide power to the active surface 202 of the electronic component 20. In some embodiments, the patterned parts 130 of the leadframe 10 are configured to provide one or more signal paths (e.g., signal paths S1, S2, S3, and S4) to the electronic component 20. In some embodiments, the patterned parts 130 are around the patterned part 120. In some embodiments, the patterned part 120 is disposed between at least two patterned parts 130. In some embodiments, the portion 111 is between the patterned part 130 and the portion 112. In some embodiments, the portions 111 which connect to ground are disposed between the patterned parts 130 which transmit signals and the portions 112 which transmit power.

In some embodiments, the patterned part 130 is electrically connected to the active surface 201 of the electronic component 20 through a conductive element 40. In some embodiments, the conductive element 40 extends along the lateral surface 203 of the electronic component 20. In some embodiments, the conductive element 40 is or includes a bonding wire. In some embodiments, each of the patterned parts 130 is electrically connected to one of the conductive pads 210 on the active surface 201 of the electronic component 20 through one of the conductive elements 40. In some embodiments, each of the patterned parts 130 is configured to provide a signal path (e.g., the signal paths S1, S2, S3, and S4) to the active surface 201 of the electronic component 20. The signal paths S1, S2, S3, and S4 provided from different patterned parts 130 transmit different signals to and/or receive different signals from the electronic component 20. In some embodiments, the patterned parts 130 are free from overlapping the electronic component 20 from a top view perspective.

The protective element 70 may be disposed on the leadframe 10. In some embodiments, the protective element 70 covers or encapsulates at least a portion of the leadframe 10. In some embodiments, the protective element 70 covers or encapsulates the electronic component 20. In some embodiments, the protective element 70 covers or encapsulates the conductive elements 40. In some embodiments, the portions 112 of the patterned part 120 are physically spaced apart from the portions 111 of the patterned part 120 by the protective element 70. In some embodiments, the protective element 70 includes an encapsulant or a dielectric structure. The protective element 70 may include an epoxy resin including fillers, a molding compound (e.g., an epoxy molding compound or other molding compound), polyimide, a phenolic compound or material, a material including a silicone dispersed therein, or a combination thereof.

According to some embodiments of the present disclosure, the patterned part 120 of the leadframe 10 is configured to provide multiple electrical paths to the passive surface 202 of the electronic component 20. Therefore, the patterned part 120 can serve as a die pad while also supplying multiple power voltages to different regions of the electronic component 20 and connecting to ground.

In addition, according to some embodiments of the present disclosure, the portions 111 which connect to ground are disposed between the patterned parts 130 which transmit signals and the portions 112 which transmit power. Therefore, the portions 111 can provide electromagnetic shielding between the power signals and the electrical signals and prevent undesired parasitic effects caused by the interference between the power signals and the electrical signals.

Moreover, according to some embodiments of the present disclosure, the portions 111 and the portions 112 are alternatingly arranged. While different portions 112 may serve to transmit different power voltages, the portions 111 connected to ground and disposed between adjacent portions 112 can mitigate or avoid the undesired interferences between different powers, and a relatively more accurate power voltage reference can be provided.

FIG. 1B is a cross-section of an electronic package 1B in accordance with some embodiments of the present disclosure. The electronic package 1B is similar to the electronic package 1A in FIG. 1A, with differences therebetween as follows. Descriptions of similar components are omitted.

In some embodiments, the electronic package 1B further includes a power regulating component 30, one or more passive components (e.g., passive components 31 and 32), and a thermal dissipation element 60. In some embodiments, the electronic component 20 includes one or more conductive pads 210 on the active surface 201 and one or more conductive pads 220 on the passive surface 202. The conductive pads 220 may include conductive bumps or solder balls.

The power regulating component 30 may be disposed under the electronic component 20. In some embodiments, the power regulating component 30 is connected to the leadframe through connection elements 240. The connection elements 240 may be or include conductive pads and/or conductive bumps. In some embodiments, the leadframe 10 is disposed below the power regulating component 30 and configured to provide power to the electronic component 20 through the power regulating component 30. In some embodiments, the power regulating component 30 is configured to receive a power (also referred to as "a first power" or "an input power") from the leadframe 10 and provide a power (also referred to as "a second power" or "a regulated power") to the electronic component 20. In some embodiments, the power regulating component 30 may be disposed between the patterned part 120 and the electronic component 20. In some embodiments, the patterned part 120 is disposed under the power regulating component 30 and electrically connected to the passive surface 202 of the electronic component 20 through the power regulating component 30. In some embodiments, the patterned part 120 is configured to provide one or more electrical paths passing the power regulating component 30 to the electronic component 20. In some embodiments, the patterned part 120 is configured to provide one or more power paths passing the power regulating component 30 to the electronic component 20. In some embodiments, the patterned part 120 is configured to provide the power paths P1 and P1a and the ground path G1 passing the power regulating component 30 to the electronic component 20. In some embodiments, the portions 111 of the patterned part 120 are connected to the power regulating component 30 and configured to provide the ground path G1. In some embodiments, the portions 112 of the patterned part 120 are connected to the power regulating component 30 and configured to provide one or more power paths (e.g., the power paths P1 and P1a). In some embodiments, the patterned part 130 of the leadframe 10 is exposed from the power regulating component 30 and electrically connected to the active surface 201 of the electronic component 20.

In some embodiments, the power regulating component 30 may include a power management integrated circuit (PMIC). The power regulating component 30 may be configured to provide one or more types of power control to one or more electronic components of the electronic package 1B. For example, the power regulating component 30 may be configured to provide regulated power to the electronic component 20. For example, the power regulating component 30 may be configured to provide one or various different output voltages to the electronic component 20. In some embodiments, the power regulating component 30 may include a voltage regulator, such as a linear regulator (configured to maintain a constant output voltage) or a switching regulator (configured to generate an output voltage higher than or lower than the input voltage). In some embodiments, the power regulating component 30 may include a step-down (buck) converter, a step-up (boost) converter, an analog-to-digital converter, a digital-to-analog converter, an AC-DC converter, a DC-DC converter, other types of converters, or a combination thereof.

In some embodiments, the passive components 31 and 32 are between the power regulating component 30 and the electronic component 20 and configured to provide power regulation. In some embodiments, the passive components 31 and 32 may be integrated with the power regulating component 30. In some embodiments, the passive components 31 and 32 may be or include one or more inductance devices (or inductors) and one or more capacitance devices (or capacitors) integrated with the voltage regulator and/or the converter. In some embodiments, the passive components 31 and 32 may further include one or more passive devices including, for example, resistors, diodes, fuses or antifuses, etc. In some embodiments, the passive devices may be included along with the inductance devices and the capacitance devices within the passive components 31 and/or 32. In some embodiments, the passive component 31 is or includes a capacitance device (or a capacitor), and the passive component 32 is or includes an inductance device (or an inductor). In some embodiments, the power path passes through the power regulating component 30, the passive component 32 (or the inductor), and the passive component 31 (or the capacitor) sequentially. In some embodiments, the power regulating component 30 and the passive components 31 and 32 may be integrated as a thin film-type component.

Supply power may be transmitted to the power regulating component 30 as an input power (or an input voltage) through the one or more power paths provided by the patterned part 120 of the leadframe 10. The power regulating component 30 may receive the input power, regulate the input power, and then provide an output power (or an output voltage) to the electronic component 20 through the power path P1 provided by the patterned part 120 of the leadframe 10.

The thermal dissipation element 60 may be between the electronic component 20 and the leadframe 10. In some embodiments, the thermal dissipation element 60 is disposed between the electronic component 20 and the patterned part 120 of the leadframe 10. In some embodiments, the thermal dissipation element 60 is disposed between at least two connection elements 240. In some embodiments, the thermal dissipation element 60 is spaced apart from the connection elements 240. In some embodiments, the power regulating component 30 is disposed between the thermal dissipation element 60 and the electronic component 20.

Figure 1C:
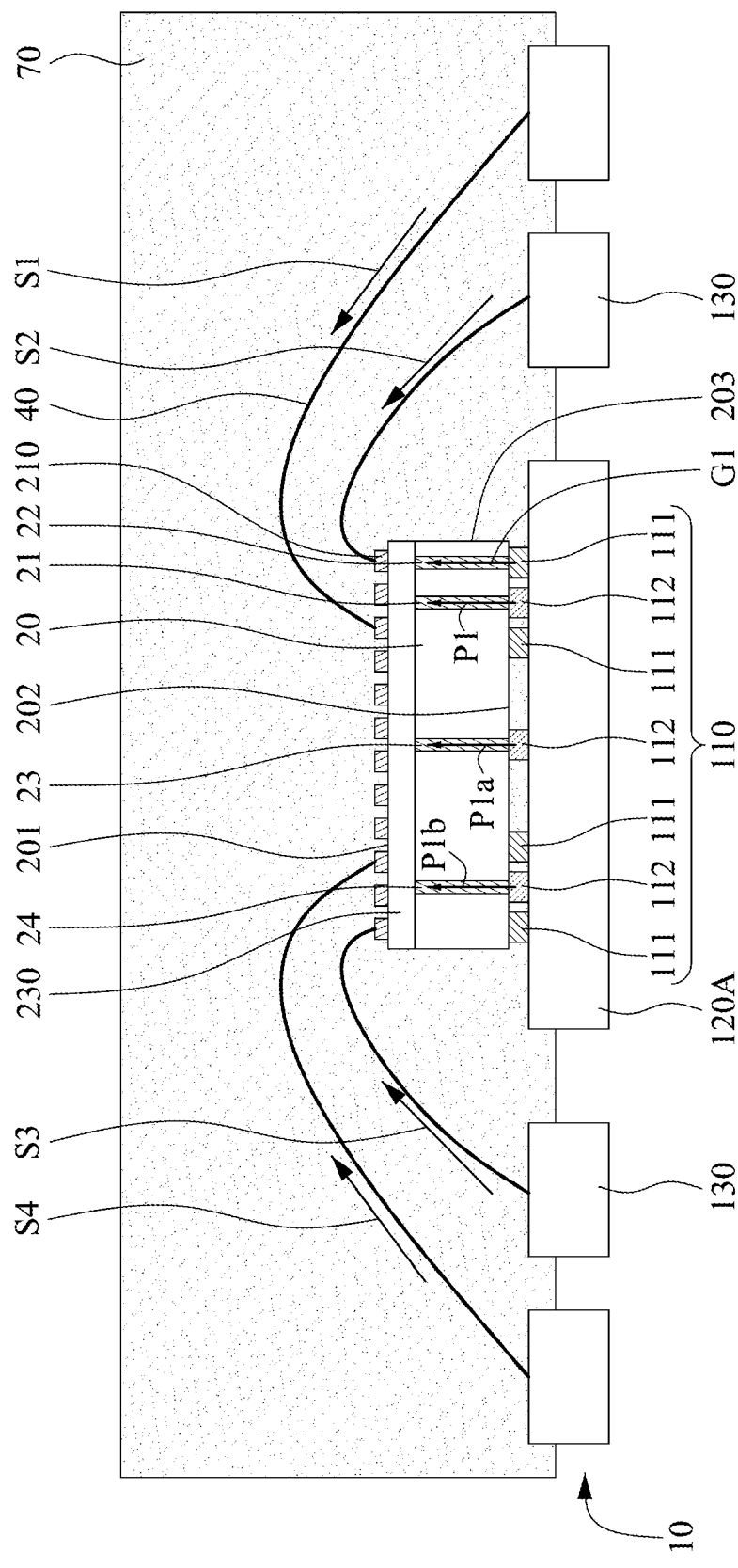
FIG. 1C is a cross-section of an electronic package in accordance with some embodiments of the present disclosure.

FIG. 1C is a cross-section of an electronic package 1C in accordance with some embodiments of the present disclosure. The electronic package 1C is similar to the electronic package 1A shown in FIG. 1A, with differences therebetween as follows. Descriptions of similar components are omitted.

In some embodiments, the leadframe 10 includes patterned parts 110, 120A, and 130. The patterned part 110 is between the patterned part 120A and the electronic component 20. In some embodiments, the patterned part 120A is configured to support the electronic component 20. In some embodiments, the combination of the patterned parts 110 and 120A may be referred to as a die pad of the leadframe 10, and the patterned parts 130 may be referred to as leads of the leadframe 10.

In some embodiments, the patterned part 110 includes portions 111 and 112. In some embodiments, the portions 111 are physically spaced apart from the portions 112. In some embodiments, the patterned part 120A is connected to ground. In some embodiments, the patterned part 120A may include an insulating body and a conductive structure disposed on and/or in the insulating body, and the conductive structure of the patterned part 120A is connected to ground. In some embodiments, the portions of the patterned part 110 are connected to ground through the patterned part 120A. In some embodiments, the patterned part 120A is physically spaced apart from the portions 112 of the patterned part 110. In some embodiments, parts of the portions 111 and 112 of the patterned part 110 may pass through the patterned part 120A.

Figure 1D:
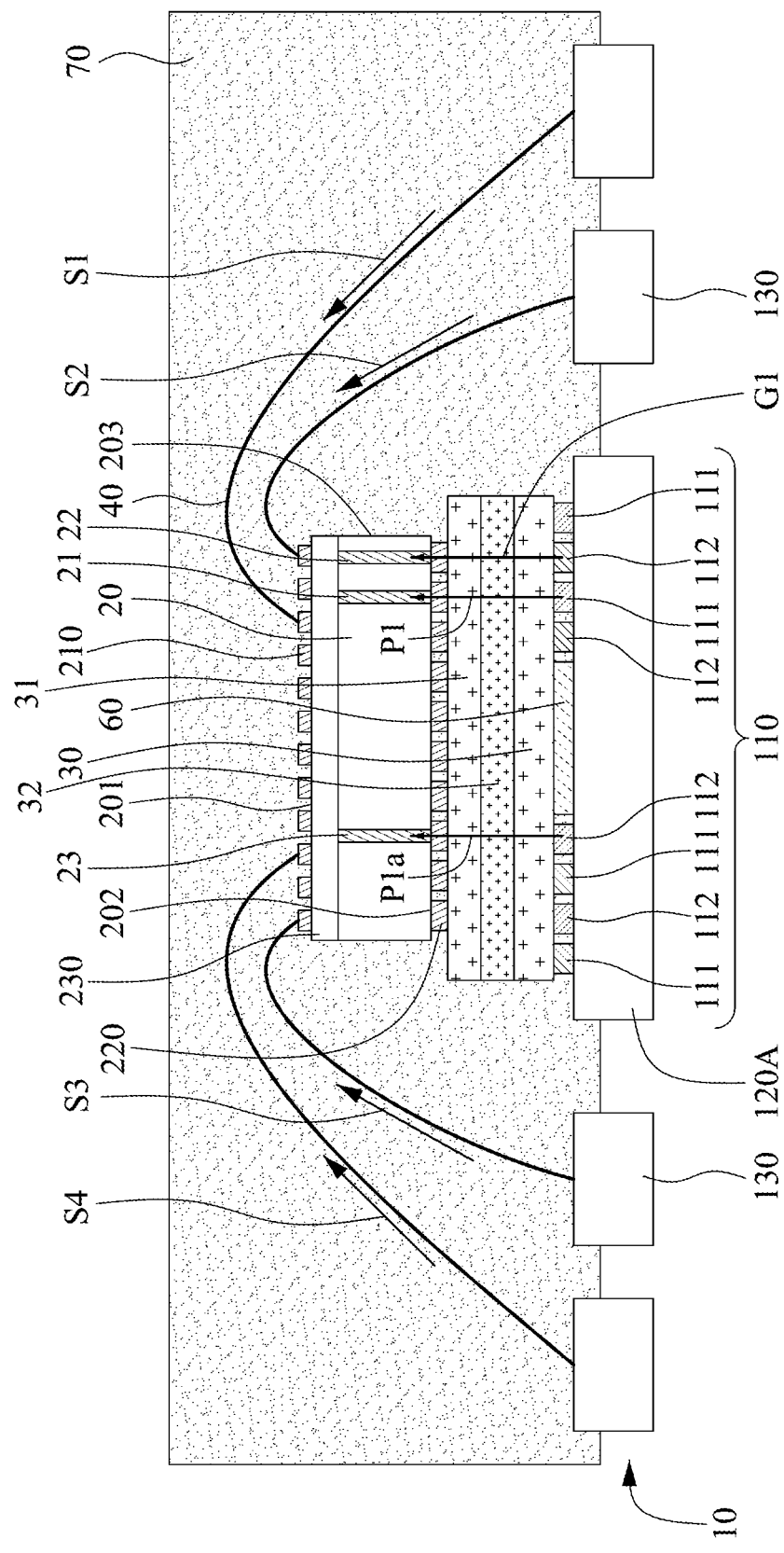
FIG. 1D is a cross-section of an electronic package in accordance with some embodiments of the present disclosure.

FIG. 1D is a cross-section of an electronic package 1D in accordance with some embodiments of the present disclosure. The electronic package 1D is similar to the electronic package 1B shown in FIG. 1B, with differences therebetween as follows. Descriptions of similar components are omitted.

In some embodiments, the thermal dissipation element 60 is disposed between at least two portions 111 and/or 112 of the patterned part 110. In some embodiments, the thermal dissipation element 60 is disposed between the portion 111 and the portion 112 of the patterned part 110. In some embodiments, the thermal dissipation element 60 is spaced apart from the portions 112.

Figure 1E:
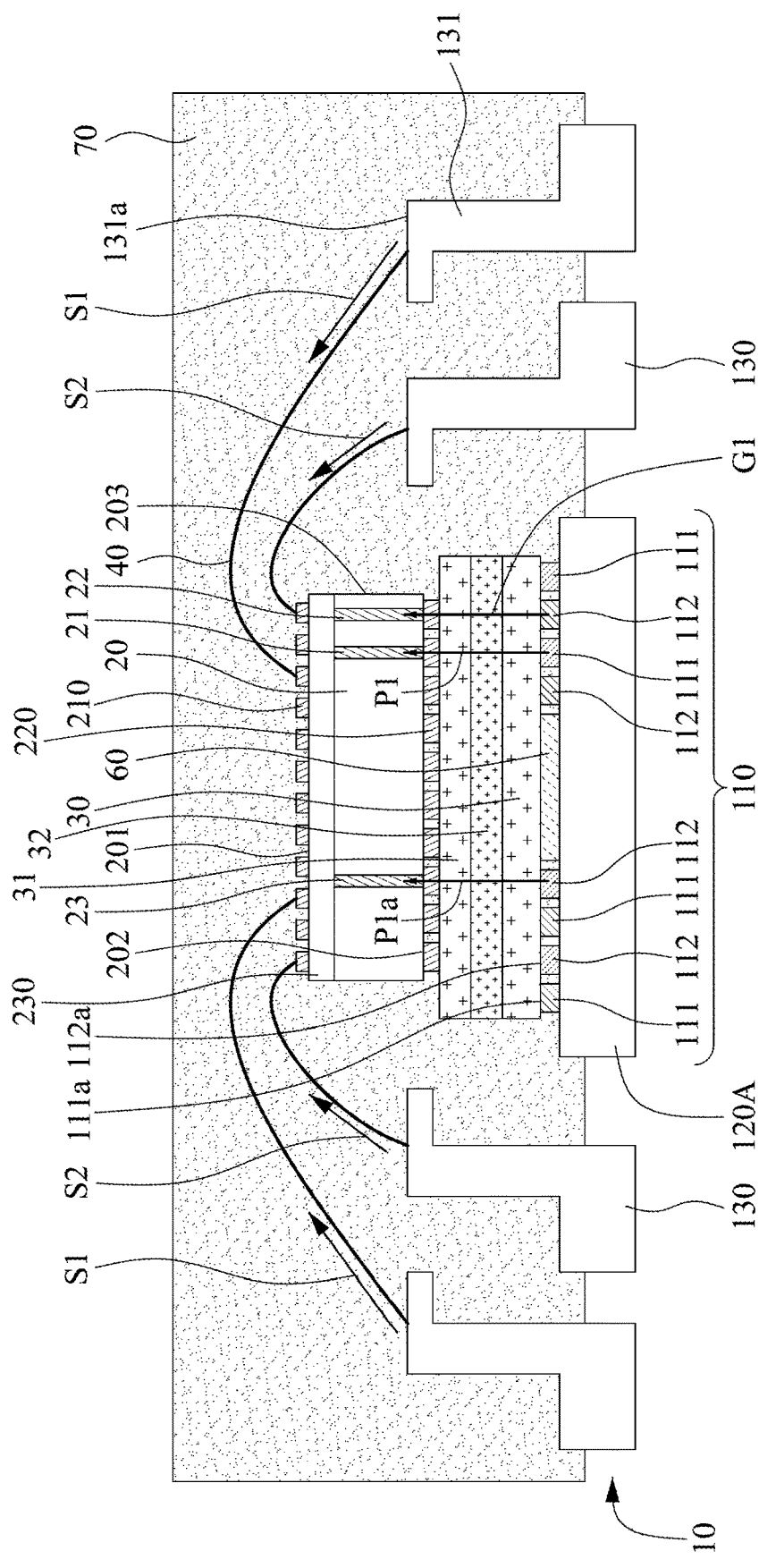
FIG. 1E is a cross-section of an electronic package in accordance with some embodiments of the present disclosure.

FIG. 1E is a cross-section of an electronic package 1E in accordance with some embodiments of the present disclosure. The electronic package 1E is similar to the electronic package 1D shown in FIG. 1D, with differences therebetween as follows. Descriptions of similar components are omitted.

In some embodiments, the patterned part 130 further includes an extending portion 131 extending upwards. In some embodiments, the extending portion 131 of the patterned part 130 has an upper surface 131a at an elevation higher than that of an upper surface (e.g., upper surfaces 111a and/or 112a) of the patterned part 120. In some embodiments, a width of the extending portion 131 is greater than or exceeds a width of the conductive element 40. In some embodiments, the patterned part 130 including the extending portion 131 constitutes a monolithic integral structure. In some embodiments, the patterned part 130 including the extending portion 131 is a lead of a leadframe.

In some embodiments, the patterned part 130 is electrically connected to the conductive element 40 through the extending portion 131. In some embodiments, each extending portion 131 of the patterned parts 130 is configured to provide a signal path (e.g., the signal paths S1, S2, S3, and S4) to the active surface 201 of the electronic component 20. In some embodiments, the upper surface 131 of the extending portion 131 of the patterned part 130 is between the active surface 201 of the electronic component 20 and the upper surface (e.g., the upper surfaces 111a and/or 112a) of the patterned part 120.

According to some embodiments of the present disclosure, the extending portion 131 of the patterned part 130 has an upper surface 131a at an elevation higher than that of an upper surface (of the patterned part 120, and thus the elevation difference between the contact region (e.g., the upper surface 131a) of the patterned part 130 and the contact region (e.g., the conductive pad 210) of the electronic component 20 can be reduced. Therefore, the length of the conductive element 40 connecting the patterned part 130 and the electronic component 20 can be reduced. In addition, the conductive element 40 is connected to the extending portion 131 which has a greater width compared to that of the conductive element 40, and thus the resistance of the signal path (e.g., the signal paths S1, S2, S3, and S4) can be further reduced.

Figure 2A:
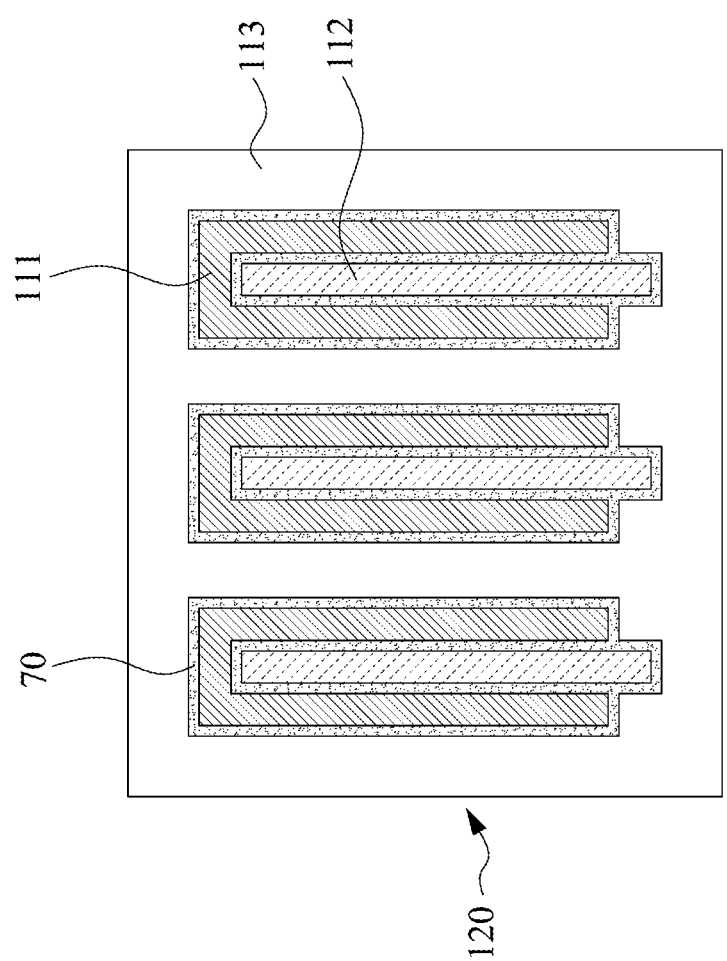
FIG. 2A is a top view of a portion of an electronic package in accordance with some embodiments of the present disclosure.

FIG. 2A is a top view of a portion of an electronic package in accordance with some embodiments of the present disclosure. In some embodiments, FIG. 2A shows a top view of the patterned part 120 of the electronic package 1A illustrated in FIG. 1A or the electronic package 1B illustrated in FIG. 1B. In some other embodiments, FIG. 2A shows a top view of the portions 111 and 112 of the patterned part 110 of any one of the electronic packages 1C-1E illustrated in FIGS. 1C-1E. It should be noted that some elements have been omitted from FIG. 2A for clarity.

In some embodiments, each of the portions 111 partially surrounds each of the portions 112. In some embodiments, every two adjacent portions 112 are separated by the portions 111. In some embodiments, the portions 111 are physically spaced apart from the portions 111 by the protective element 70. In some embodiments, the portions 111 and 112 are physically spaced apart from the portions 113 by the protective element 70. In some embodiments, the portions 112 are connected to the same power voltage or different power voltages.

Figure 2B:
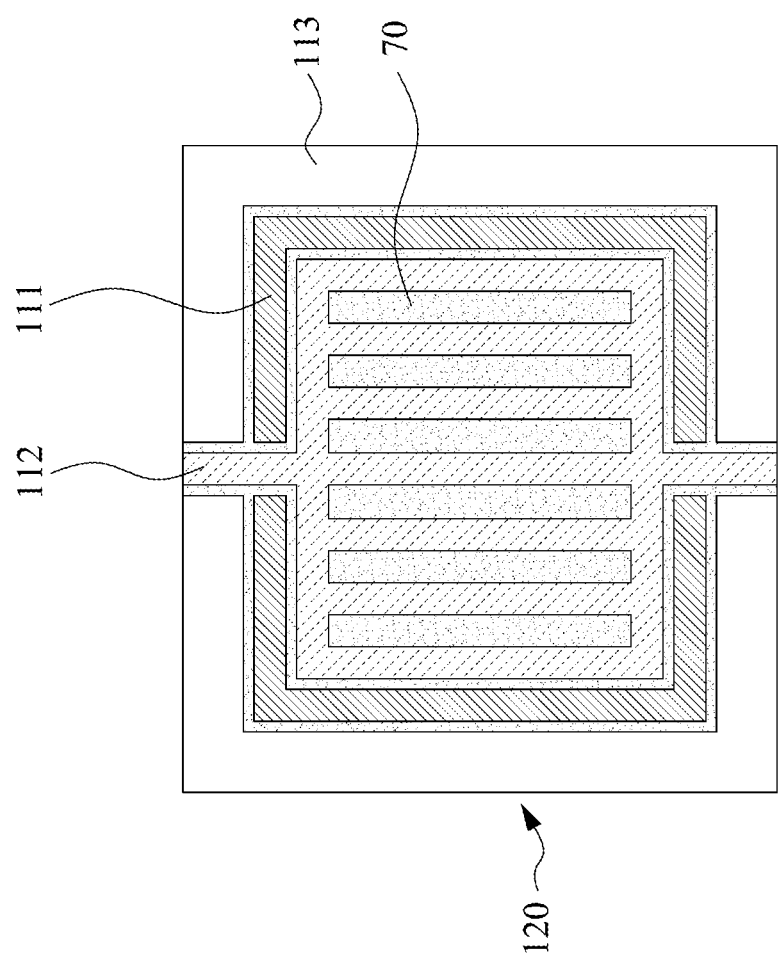
FIG. 2B is a top view of a portion of an electronic package in accordance with some embodiments of the present disclosure.

FIG. 2B is a top view of a portion of an electronic package in accordance with some embodiments of the present disclosure. In some embodiments, FIG. 2B shows a top view of the patterned part 120 of the electronic package 1A illustrated in FIG. 1A or the electronic package 1B illustrated in FIG. 1B. In some other embodiments, FIG. 2B shows a top view of the portions 111 and 112 of the patterned part 110 of any one of the electronic packages 1C-1E illustrated in FIGS. 1C-1E. It should be noted that some elements have been omitted from FIG. 2B for clarity.

In some embodiments, the portion 111 may be or include a ground ring around the portions 112. In some embodiments, the ground ring includes two portions 111 located at opposite sides of the portions 112. In some embodiments, the portions 112 include a plurality of conductive lines or strips connected to each other and substantially surrounded or partially surrounded by the ground ring formed of the portions 111. In some embodiments, the portions 112 are connected to the same power voltage.

Figure 2C:
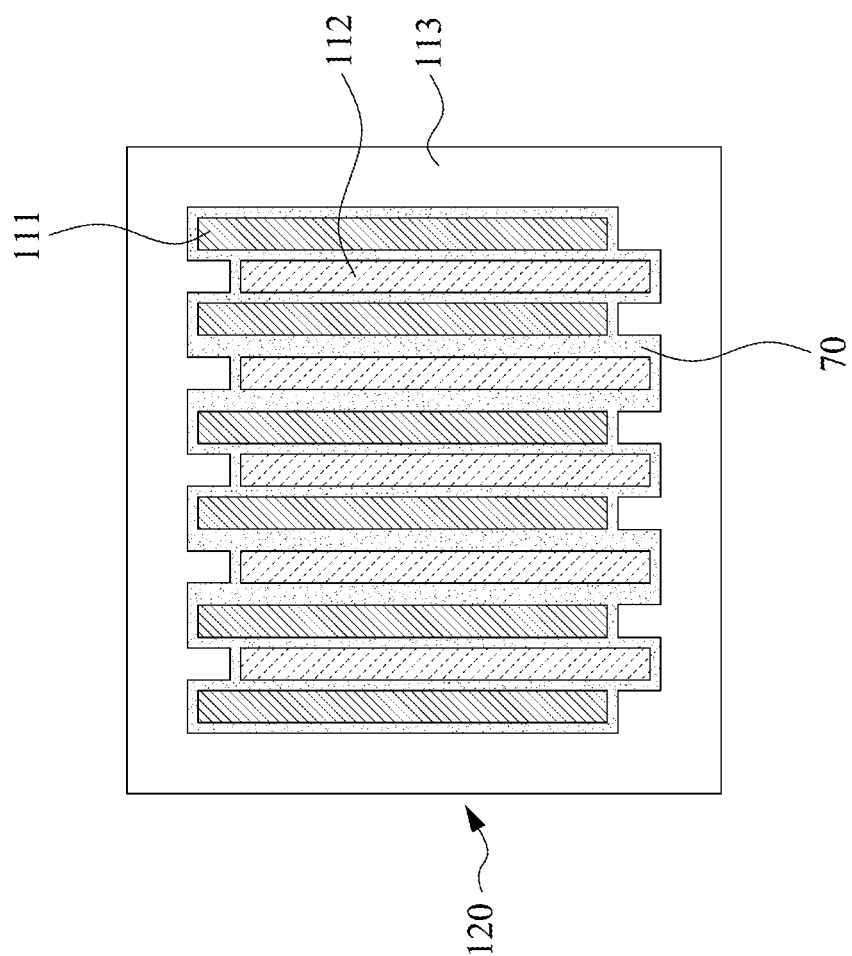
FIG. 2C is a top view of a portion of an electronic package in accordance with some embodiments of the present disclosure.

FIG. 2C is a top view of a portion of an electronic package in accordance with some embodiments of the present disclosure. In some embodiments, FIG. 2C shows a top view of the patterned part 120 of the electronic package 1A illustrated in FIG. 1A or the electronic package 1B illustrated in FIG. 1B. In some other embodiments, FIG. 2C shows a top view of the portions 111 and 112 of the patterned part 110 of any one of the electronic packages 1C-1E illustrated in FIGS. 1C-1E. It should be noted that some elements have been omitted from FIG. 2C for clarity.

In some embodiments, the portions 111 and the portions 112 include conductive lines or strips and alternate or are arranged alternatingly. In some embodiments, every two adjacent portions 112 are separated by at least one portion 111. In some embodiments, the portions 111 are located at peripheral regions of the patterned part 120. In some embodiments, the portions 112 are connected to the same power voltage.

Figure 2D:
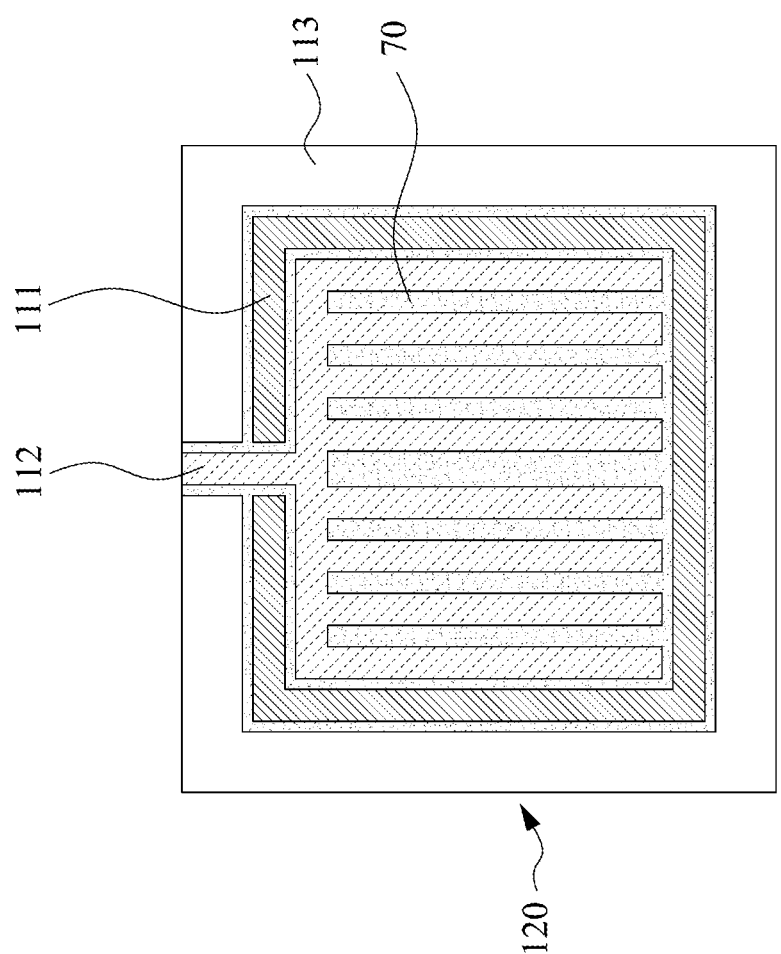
FIG. 2D is a top view of a portion of an electronic package in accordance with some embodiments of the present disclosure.

FIG. 2D is a top view of a portion of an electronic package in accordance with some embodiments of the present disclosure. In some embodiments, FIG. 2D shows a top view of the patterned part 120 of the electronic package 1A illustrated in FIG. 1A or the electronic package 1B illustrated in FIG. 1B. In some other embodiments, FIG. 2D shows a top view of the portions 111 and 112 of the patterned part 110 of any one of the electronic packages 1C-1E illustrated in FIGS. 1C-1E. It should be noted that some elements have been omitted from FIG. 2D for clarity.

In some embodiments, the portion 111 includes a ground ring that has one opening through which the portion 112 extends. In some embodiments, the portions 112 include a plurality of conductive lines or strips connected to each other and substantially surrounded or partially surrounded by the ground ring formed of the portion 111. In some embodiments, the portions 112 are connected to the same power voltage or different power voltages.

Figure 2E:
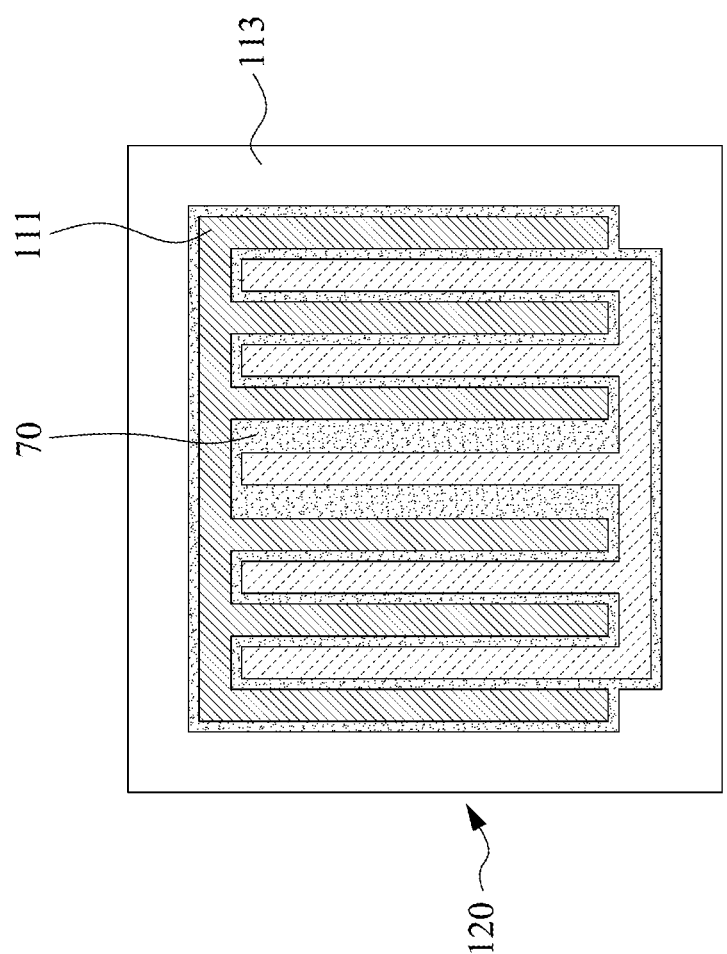
FIG. 2E is a top view of a portion of an electronic package in accordance with some embodiments of the present disclosure.

FIG. 2E is a top view of a portion of an electronic package in accordance with some embodiments of the present disclosure. In some embodiments, FIG. 2E shows a top view of the patterned part 120 of the electronic package 1A illustrated in FIG. 1A or the electronic package 1B illustrated in FIG. 1B. In some other embodiments, FIG. 2E shows a top view of the portions 111 and 112 of the patterned part 110 of any one of the electronic packages 1C-1E illustrated in FIGS. 1C-1E. It should be noted that some elements have been omitted from FIG. 2E for clarity.

In some embodiments, the portions 111 form a comb structure, and the portions 112 form a comb structure. The portions 111 and the portions 112 alternate or are arranged alternatingly. In some embodiments, the portions 112 are connected to the same power voltage.

Figure 2F:
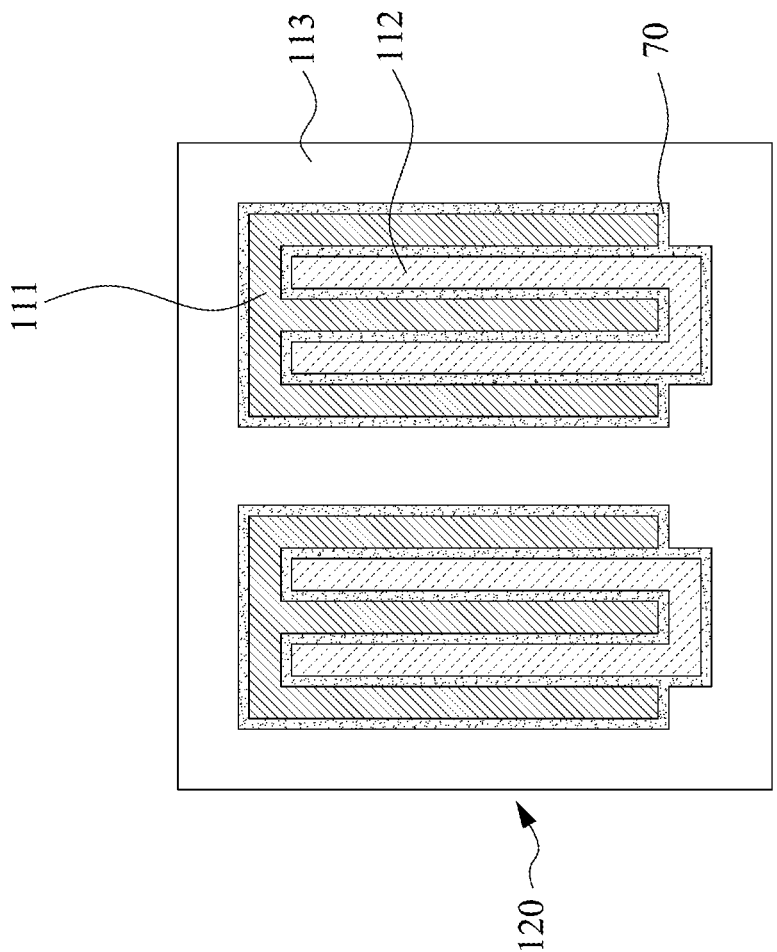
FIG. 2F is a top view of a portion of an electronic package in accordance with some embodiments of the present disclosure.

FIG. 2F is a top view of a portion of an electronic package in accordance with some embodiments of the present disclosure. In some embodiments, FIG. 2F shows a top view of the patterned part 120 of the electronic package 1A illustrated in FIG. 1A or the electronic package 1B illustrated in FIG. 1B. In some other embodiments, FIG. 2F shows a top view of the portions 111 and 112 of the patterned part 110 of any one of the electronic packages 1C-1E illustrated in FIGS. 1C-1E. It should be noted that some elements have been omitted from FIG. 2F for clarity.

In some embodiments, the portions 111 form two comb structures separated from each other, and the portions 112 form two comb structures separated from each other. The portions 111 and the portions 112 alternate or are arranged alternatingly. In some embodiments, the portions 112 are connected to the same power voltage or different power voltages.

Figure 2G:
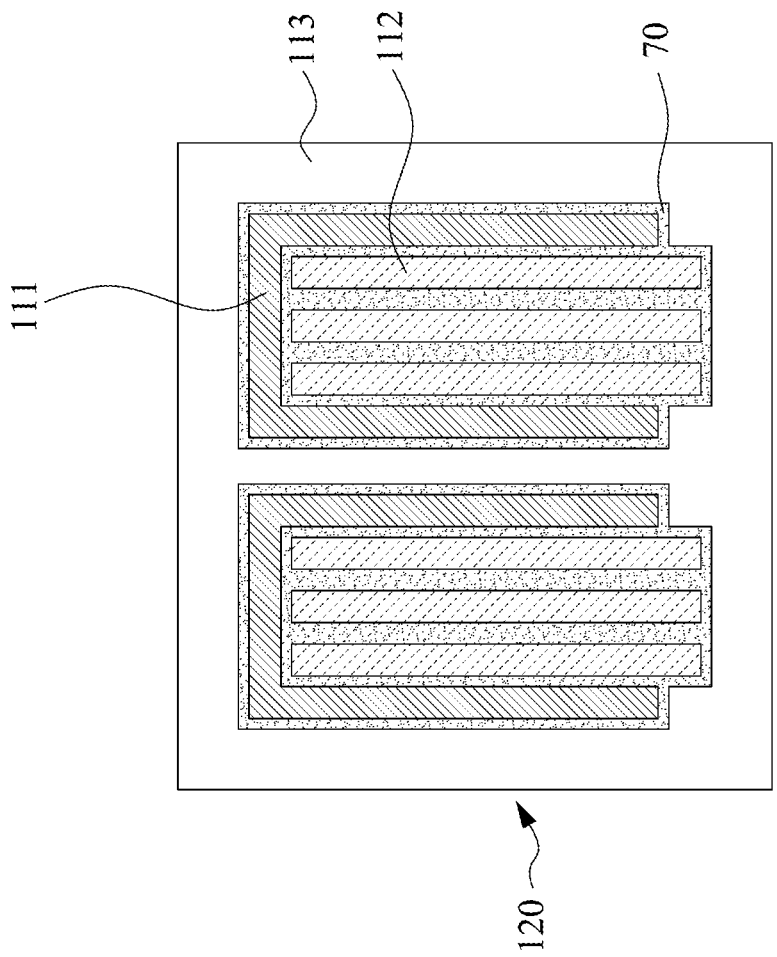
FIG. 2G is a top view of a portion of an electronic package in accordance with some embodiments of the present disclosure.

FIG. 2G is a top view of a portion of an electronic package in accordance with some embodiments of the present disclosure. In some embodiments, FIG. 2G shows a top view of the patterned part 120 of the electronic package 1A illustrated in FIG. 1A or the electronic package 1B illustrated in FIG. 1B. In some other embodiments, FIG. 2G shows a top view of the portions 111 and 112 of the patterned part 110 of any one of the electronic packages 1C-1E illustrated in FIGS. 1C-1E. It should be noted that some elements have been omitted from FIG. 2G for clarity.

In some embodiments, the portions 111 form two semi-rings or two rings each having an opening. In some embodiments, the portions 112 are grouped into two sets of conductive lines or strips, and each group of the portions 112 is substantially surrounded or partially surrounded by the portions 111. In some embodiments, the semi-rings formed from the portions 111 are located at peripheral regions with respect to the portions 112. In some embodiments, the portions 112 are connected to the same power voltage or different power voltages.

Figure 2H:
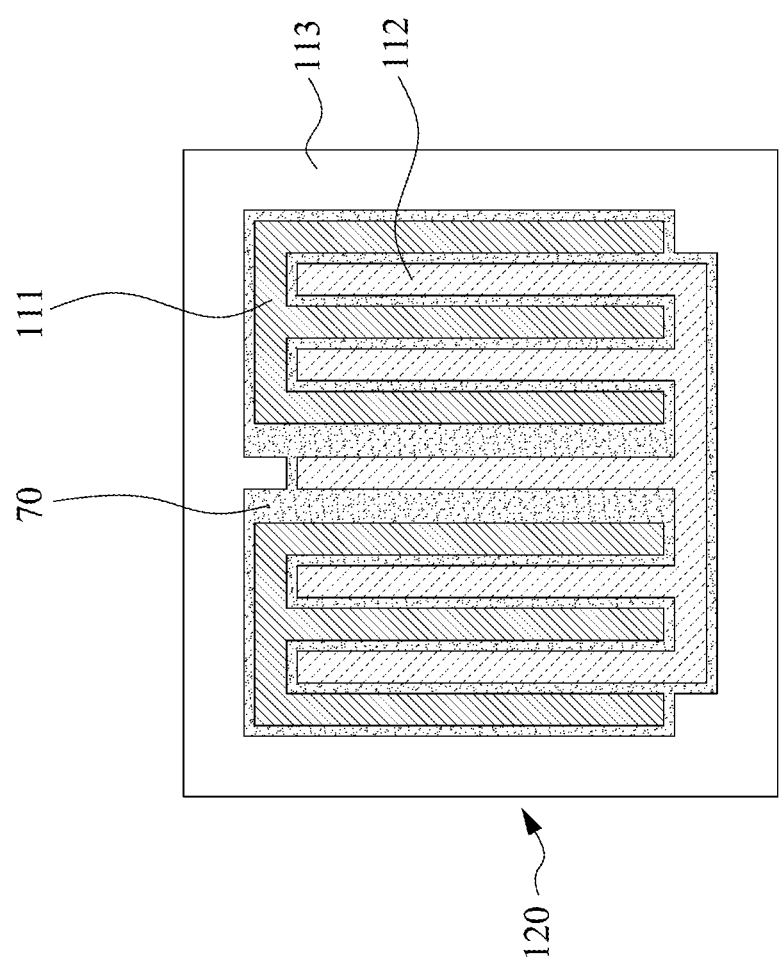
FIG. 2H is a top view of a portion of an electronic package in accordance with some embodiments of the present disclosure.

FIG. 2H is a top view of a portion of an electronic package in accordance with some embodiments of the present disclosure. In some embodiments, FIG. 2H shows a top view of the patterned part 120 of the electronic package 1A illustrated in FIG. 1A or the electronic package 1B illustrated in FIG. 1B. In some other embodiments, FIG. 2H shows a top view of the portions 111 and 112 of the patterned part 110 of any one of the electronic packages 1C-1E illustrated in FIGS. 1C-1E. It should be noted that some elements have been omitted from FIG. 2H for clarity.

In some embodiments, the portions 111 form two comb structures separated from each other, and the portions 112 form a comb structure. The portions 111 and the portions 112 alternate or are arranged alternatingly. In some embodiments, the portions 112 are connected to the same power voltage.

Figure 2I:
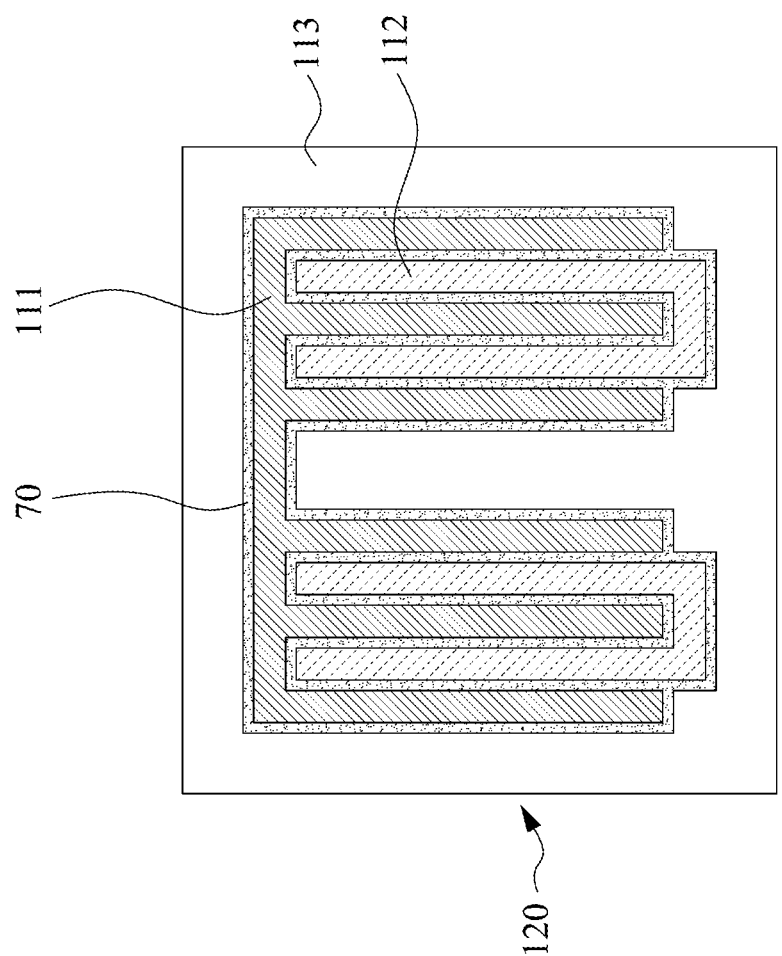
FIG. 2I is a top view of a portion of an electronic package in accordance with some embodiments of the present disclosure.

FIG. 2I is a top view of a portion of an electronic package in accordance with some embodiments of the present disclosure. In some embodiments, FIG. 2I shows a top view of the patterned part 120 of the electronic package 1A illustrated in FIG. 1A or the electronic package 1B illustrated in FIG. 1B. In some other embodiments, FIG. 2I shows a top view of the portions 111 and 112 of the patterned part 110 of any one of the electronic packages 1C-1E illustrated in FIGS. 1C-1E. It should be noted that some elements have been omitted from FIG. 2I for clarity.

In some embodiments, the portions 111 form a comb structure, and the portions 112 form two comb structures separated from each other. The portions 111 and the portions 112 alternate or are arranged alternatingly. In some embodiments, the portions 112 are connected to the same power voltage or different power voltages.

According to some embodiments of the present disclosure, the portions 111 which connect to ground surround or partially surround the portions 112 which transmit power. Therefore, the portions 111 can provide electromagnetic shielding between the power signals and the electrical signals and prevent undesired parasitic effects caused by the interference between the power signals and the electrical signals.

Figure 3:
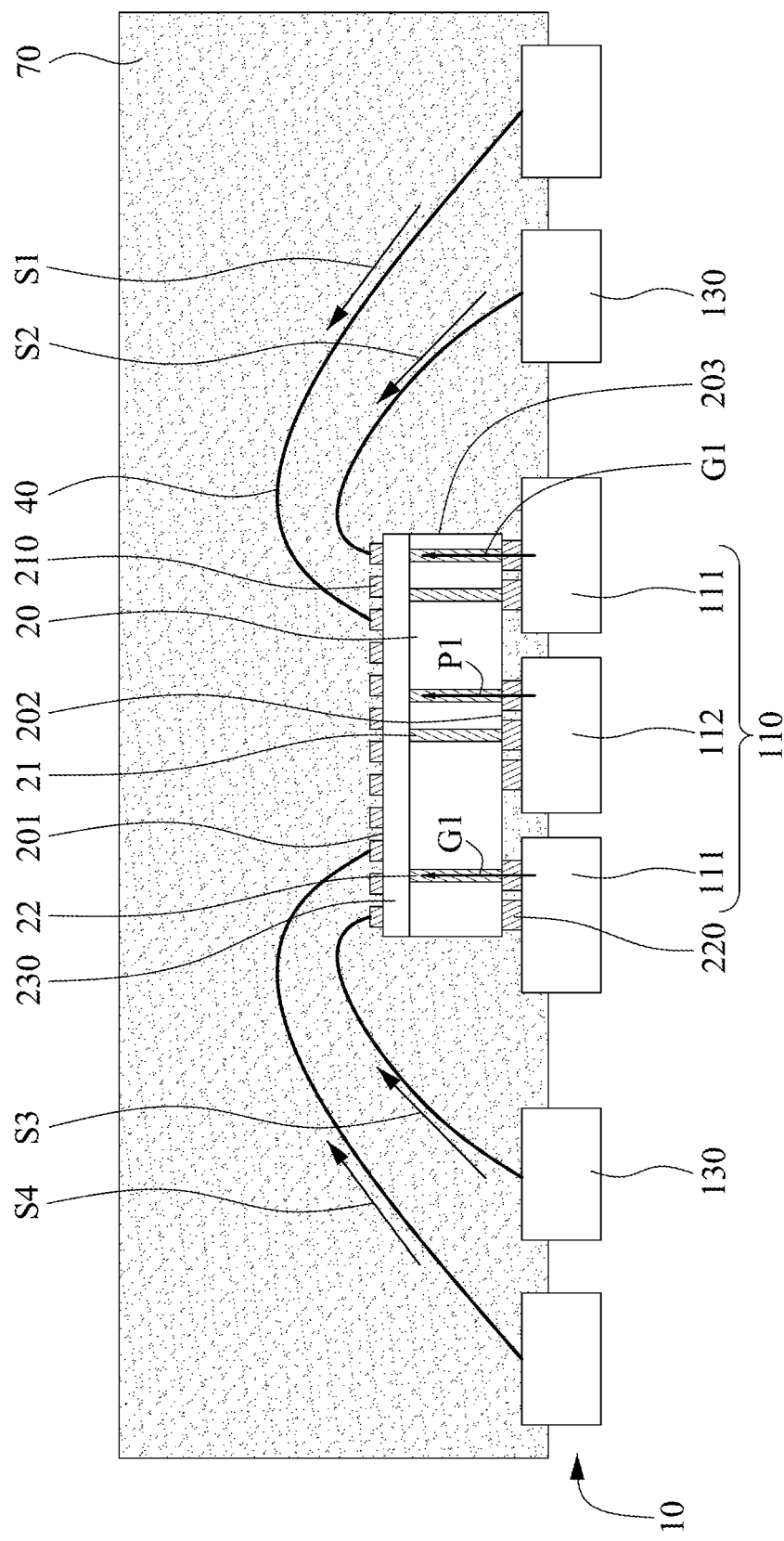
FIG. 3 is a cross-section of an electronic package in accordance with some embodiments of the present disclosure.

FIG. 3 is a cross-section of an electronic package 3 in accordance with some embodiments of the present disclosure. The electronic package 3 is similar to the electronic package 1A in FIG. 1A, with differences therebetween as follows. Descriptions of similar components are omitted.

In some embodiments, the leadframe 10 includes the patterned part 110 (or the patterned die pad) and the patterned parts 130 (or the leads). In some embodiments, the patterned part 110 includes portions 111 and 112 separated from each other. In some embodiments, the patterned part 110 is configured to provide the power path P1 and the ground paths G1 and to support the electronic component 20. In some embodiments, the patterned part 110 includes a plurality of portions 112 providing a plurality of power paths configured to transmit the same power voltage or different power voltages. The number of the portions 112 and the number of the power paths provided by the portions 112 may vary according to actual application, and the present disclosure is not limited thereto.

Figure 4:
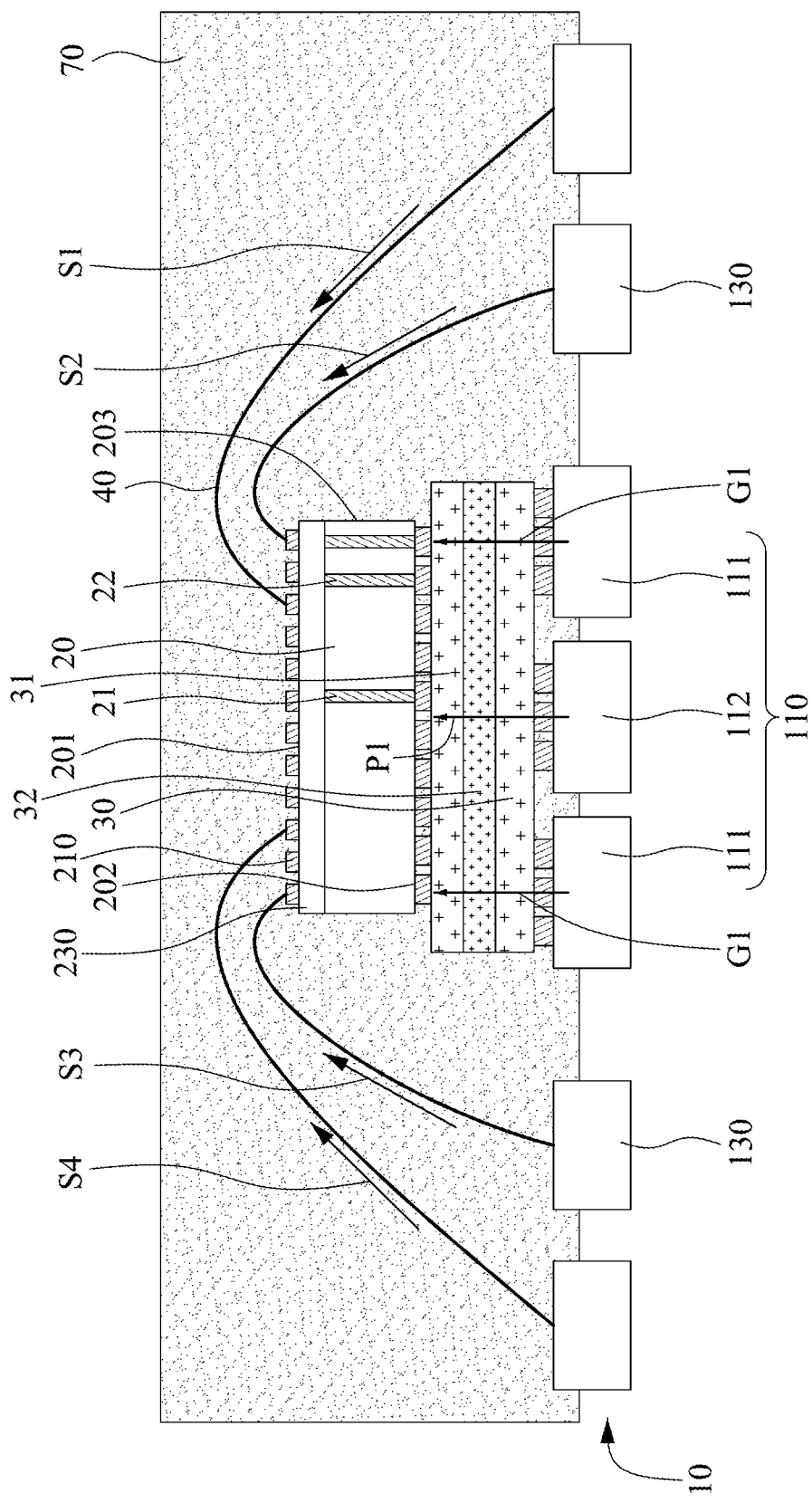
FIG. 4 is a cross-section of an electronic package in accordance with some embodiments of the present disclosure.

FIG. 4 is a cross-section of an electronic package 4 in accordance with some embodiments of the present disclosure. The electronic package 4 is similar to the electronic package 3 in FIG. 3, with differences therebetween as follows. Descriptions of similar components are omitted.

In some embodiments, the electronic package 4 further includes a power regulating component 30. In some embodiments, the patterned part 110 is under the power regulating component 30 and electrically connected to the passive surface 202 of the electronic component 20 through the power regulating component 30. In some embodiments, the patterned part 110 is configured to provide one or more electrical paths passing the power regulating component 30 to the electronic component 20. In some embodiments, the patterned part 110 is configured to provide the power path P1 and the ground paths G1 passing the power regulating component 30 to the electronic component 20.

Figure 5:
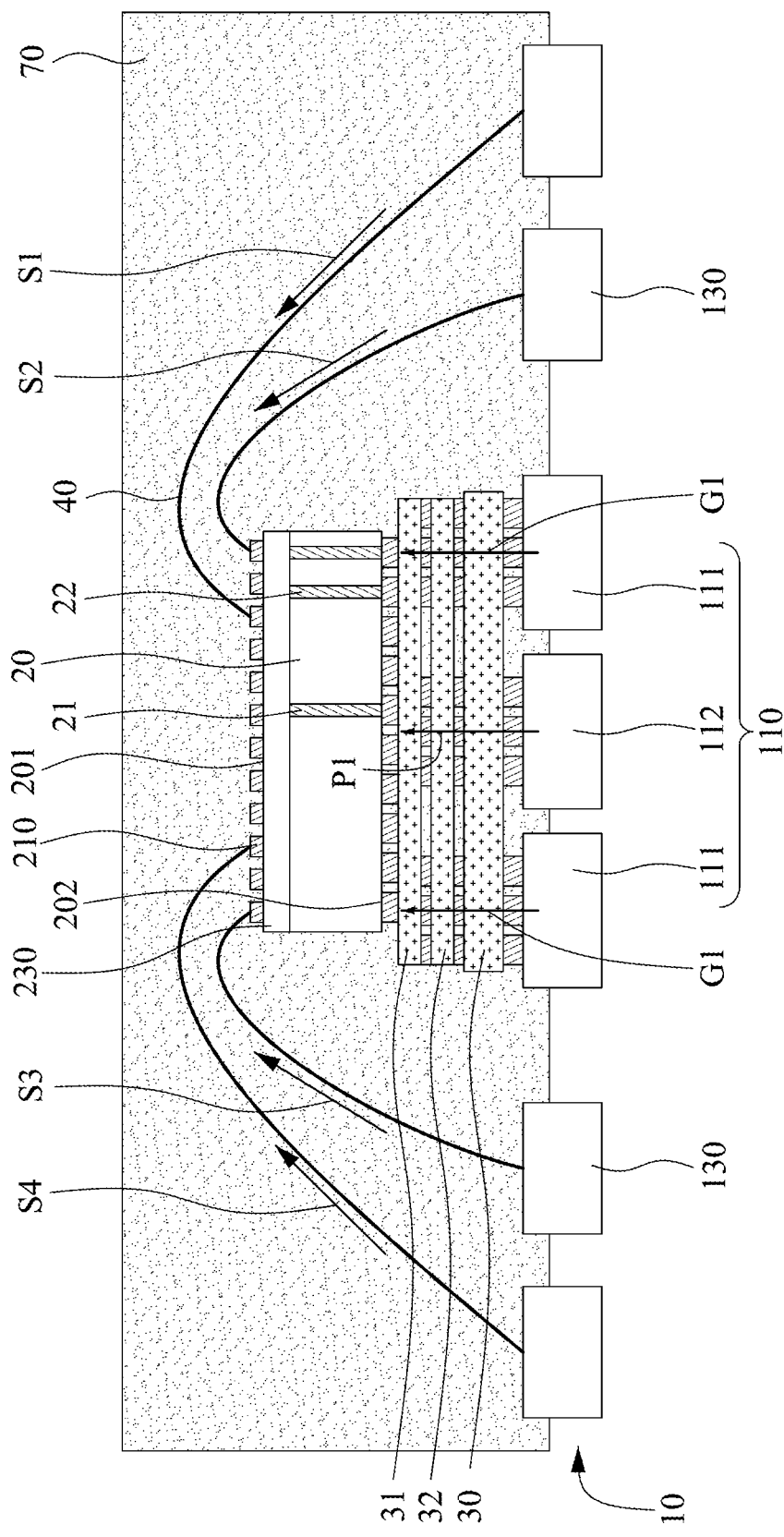
FIG. 5 is a cross-section of an electronic package in accordance with some embodiments of the present disclosure.

FIG. 5 is a cross-section of an electronic package 5 in accordance with some embodiments of the present disclosure. The electronic package 4 is similar to the electronic package 3 in FIG. 3, with differences therebetween as follows. Descriptions of similar components are omitted.

In some embodiments, the electronic package 5 further includes a power regulating component 30 and one or more passive components (e.g., passive components 31 and 32). In some embodiments, the one or more passive components may be disposed between the electronic component 20 and the power regulating component 30.

In some embodiments, the power regulating component 30 may include a voltage regulator, such as a linear regulator (configured to maintain a constant output voltage) or a switching regulator (configured to generate an output voltage higher than or lower than the input voltage). In some embodiments, the power regulating component 30 may include a step-down (buck) converter, a step-up (boost) converter, an analog-to-digital converter, a digital-to-analog converter, an AC-DC converter, a DC-DC converter, other types of converters, or a combination thereof.

In some embodiments, the passive components 31 and 32 may be or include one or more inductance devices (or inductors) and one or more capacitance devices (or capacitors). In some embodiments, the passive components 31 and 32 may further include one or more passive devices including, for example, resistors, diodes, fuses, or antifuses, etc. In some embodiments, the passive devices may be included along with the inductance devices and/or the capacitance devices within the passive components 31 and/or 32. In some embodiments, the passive component 31 is or includes a capacitance device (or a capacitor), and the passive component 32 is or includes an inductance device (or an inductor).

In some embodiments, the passive components 31 and 32 and the power regulating component 30 are electrically connected to each other through connection elements including, for example, conductive pads, conductive studs, or conductive bumps.

Figure 6A:
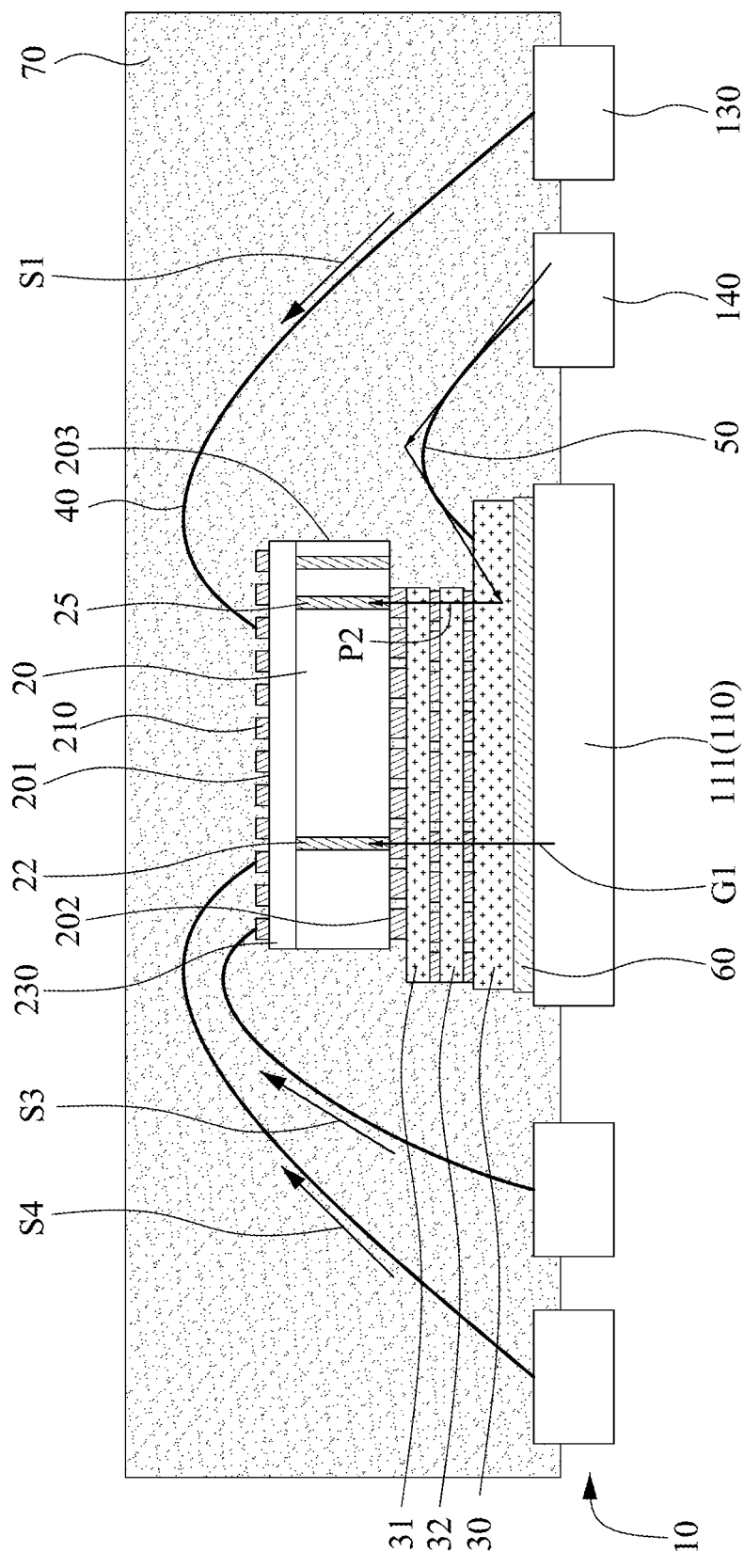
FIG. 6A is a cross-section of an electronic package in accordance with some embodiments of the present disclosure.

FIG. 6A is a cross-section of an electronic package 6 in accordance with some embodiments of the present disclosure. The electronic package 6A is similar to the electronic package 5 in FIG. 5, with differences therebetween as follows. Descriptions of similar components are omitted.

In some embodiments, the leadframe 10 further includes one or more patterned parts 140 electrically connected to the power regulating component 30. In some embodiments, the patterned part 140 is electrically connected to the power regulating component 30 through a conductive element 50. In some embodiments, the conductive element 50 is or includes a bonding wire. In some embodiments, the patterned part 140 is free from overlapping or fails to overlap the electronic component 20 from a top view perspective. In some embodiments, the patterned part 140 is configured to provide an electrical path (e.g., path P2) passing the power regulating component 30 and the passive component (e.g., the passive components 31 and 32) to the electronic component 20. In some embodiments, the patterned part 140 is configured to provide a power path P2 passing the power regulating component 30 and the passive component 31 and 32 to the electronic component 20. In some embodiments, the power path P2 passes through the conductive element 50, the power regulating component 30, and the passive component 31 and 32 to the electronic component 20. In some embodiments, the power path P2 further passes through the passive surface 202 and a conductive via 25 to the active surface 201 of the electronic component 20.

In some embodiments, the thermal dissipation element 60 is between the patterned part 110 and the power regulating component 30. In some embodiments, the thermal dissipation element 60 is disposed on the portion 111 of the patterned part 110. In some embodiments, the portion 111 is connected to ground and configured to provide a ground path G1 passing the thermal dissipation element 60, the power regulating component 30, and the passive components 31 and 32.

Figure 6B:
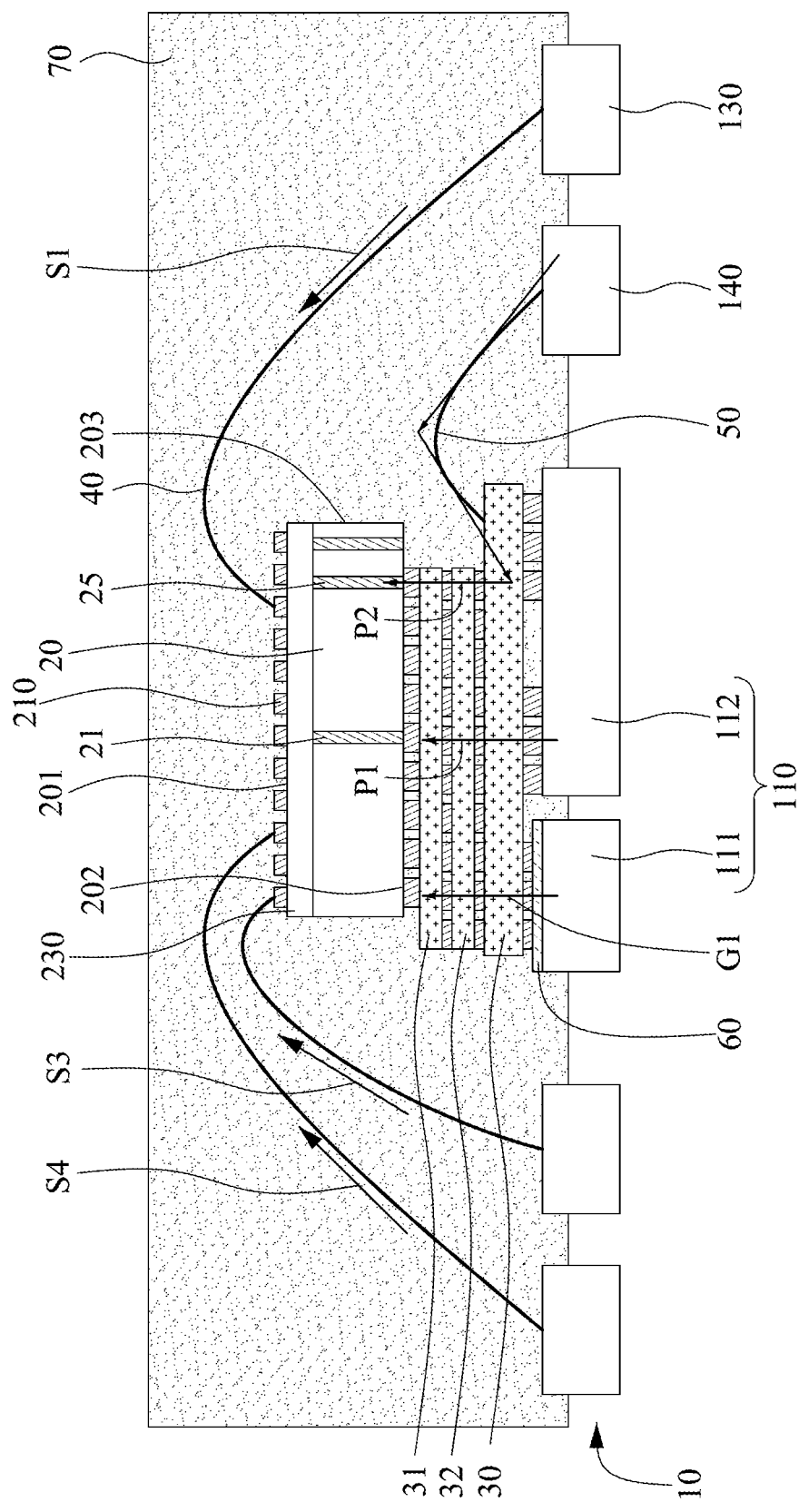
FIG. 6B is a cross-section of an electronic package in accordance with some embodiments of the present disclosure.

FIG. 6B is a cross-section of an electronic package 6B in accordance with some embodiments of the present disclosure. The electronic package 6B is similar to the electronic package 6A in FIG. 6A, with differences therebetween as follows. Descriptions of similar components are omitted.

In some embodiments, the patterned part 110 includes portions 111 and 112. In some embodiments, the thermal dissipation element 60 is disposed on the portion 111 of the patterned part 110. In some embodiments, the patterned part 110 is configured to provide power paths P1 and P2 passing the passive surface 202 of the electronic component 20.

In some embodiments, the thermal dissipation element 60 is disposed on the portion 111 of the patterned part 110. In some embodiments, the portion 111 is connected to ground. In some embodiments, the thermal dissipation element 60 is spaced apart from the portions 112. Therefore, the power path(s) provided by the portions 112 can remain unaffected by the thermal dissipation element 60, e.g., heat generated or an increase in resistance resulting from the thermal dissipation element 60 contacting the portions 112.

Figure 7A:
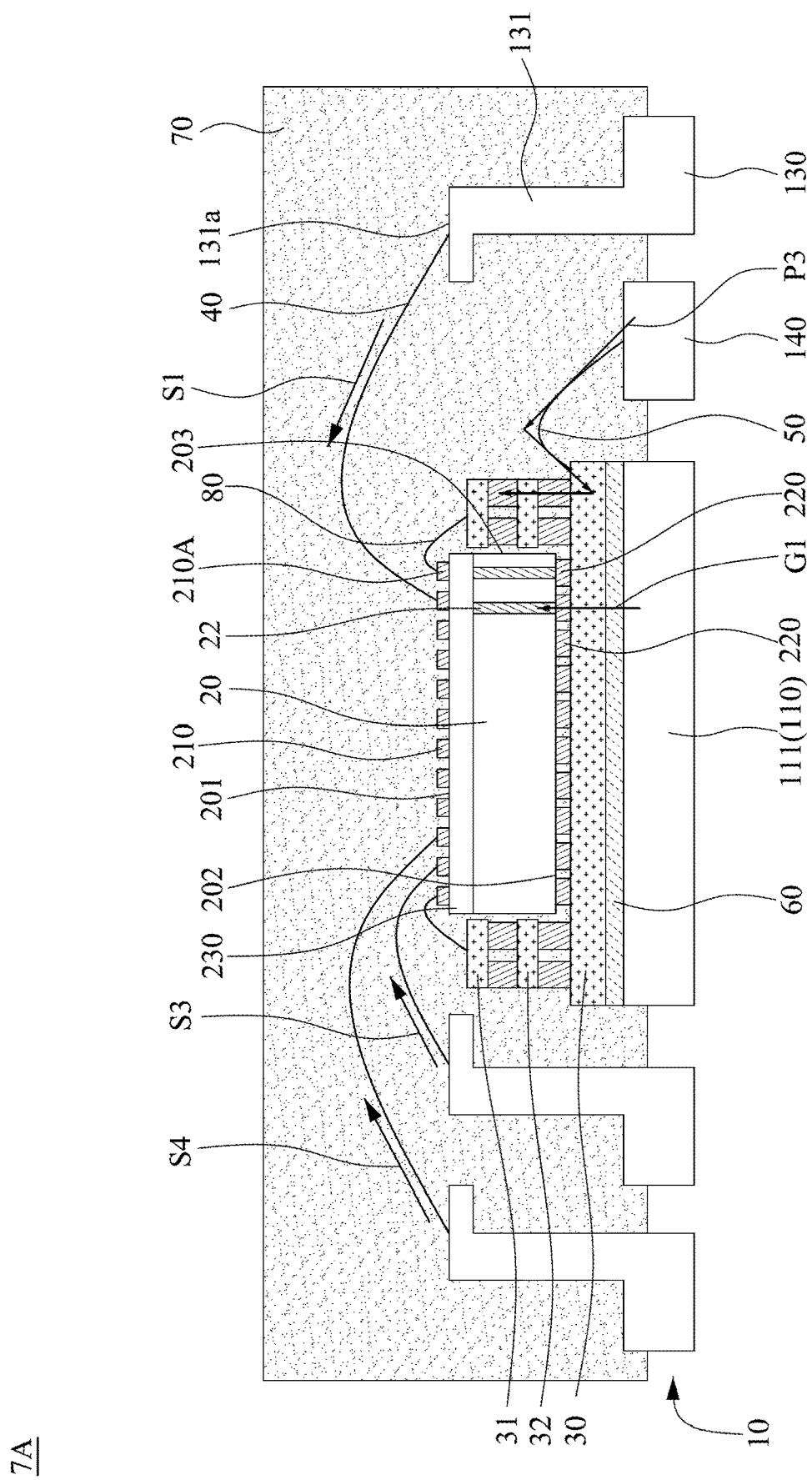
FIG. 7A is a cross-section of an electronic package in accordance with some embodiments of the present disclosure.

FIG. 7A is a cross-section of an electronic package 7A in accordance with some embodiments of the present disclosure. The electronic package 7A is similar to the electronic package 6A in FIG. 6A, with differences therebetween as follows. Descriptions of similar components are omitted.

In some embodiments, the passive components 31 and 32 are disposed on the power regulating component 30 and adjacent to the electronic component 20. In some embodiments, the passive components 31 and 32 electrically connect to at least one conductive pad 210A on the active surface 201 of the electronic component 20 through a conductive element 80. In some embodiments, the conductive element 80 is or includes a bonding wire.

In some embodiments, the leadframe 10 is configured to provide a power path (e.g., path P3) to the active surface 201 of the electronic component 20. In some embodiments, the patterned part 140 is free from overlapping or fails to overlap the electronic component 20 from a top view perspective. In some embodiments, the patterned part 140 is configured to provide an electrical path (e.g., path P3) passing the power regulating component 30 and the passive component (e.g., the passive components 31 and 32) to the active surface 201 of the electronic component 20. In some embodiments, the patterned part 140 is configured to provide a power path P3 passing the power regulating component 30 and the passive component 31 and 32 to the active surface 201 of the electronic component 20. In some embodiments, the power path P3 passes through the conductive element 50, the power regulating component 30, and the passive component 31 and 32 to the active surface 201 of the electronic component 20. In some embodiments, the power path P3 further passes through the conductive element 80 to the active surface 201 of the electronic component 20. In some embodiments, the power path P3 extends along the lateral surface 203 of the electronic component 20.

Figure 7B:
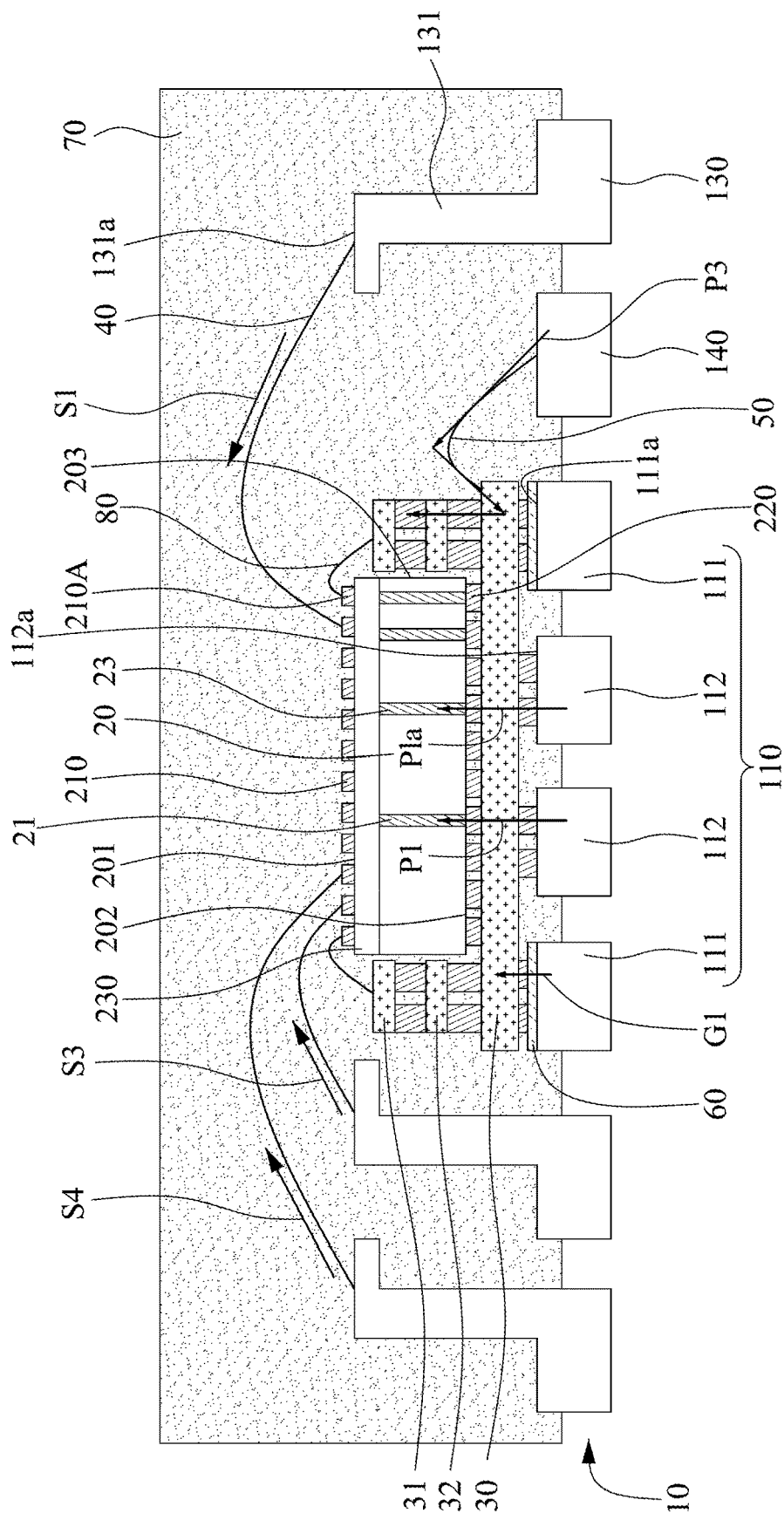
FIG. 7B is a cross-section of an electronic package in accordance with some embodiments of the present disclosure.

FIG. 7B is a cross-section of an electronic package 7B in accordance with some embodiments of the present disclosure. The electronic package 7B is similar to the electronic package 7A in FIG. 7A, with differences therebetween as follows. Descriptions of similar components are omitted.

In some embodiments, the leadframe 10 is configured to provide a power path (e.g., the path P3) to the active surface 201 of the electronic component 20 and a power path (e.g., the paths P1*a* and P1*b*) to the passive surface 202 of the electronic component 20. In some embodiments, the power paths P1*a* and P1*b* pass the passive surface 202 of the electronic component 20. In some embodiments, the patterned part 110 includes portions 111 and 112 separated from each other. In some embodiments, the portions 112 of the patterned part 110 (or the patterned die pad) are configured to provide the power paths P1 and P1*a* passing the power regulating component 30 to the passive surface 202 of the electronic component 20. In some embodiments, the patterned part 140 of the leadframe 10 (or the leadframe) is configured to provide a power path P3 passing the conductive element 50, the power regulating component 30, the passive components 31 and 32, and the conductive element 80 to the active surface 201 of the electronic component 20.

According to some embodiments of the present disclosure, the leadframe 10 includes the patterned part 110 configured to provide an electrical path (e.g., the power paths P1 and P1*a*) passing the power regulating component 30 and another electrical path (e.g., the power path P3) passing the power regulating component 30 and the passive components 31 and 32. Thus, the leadframe 10 can provide multiple types of regulated input power including one regulated by the power regulating component 30 and another regulated by the power regulating component 30 and further regulated by the passive components 31 and 32. Therefore, the electronic component 20 of the electronic package can include a greater diversity of devices which receive multiple types of regulated input powers.

Figure 8:
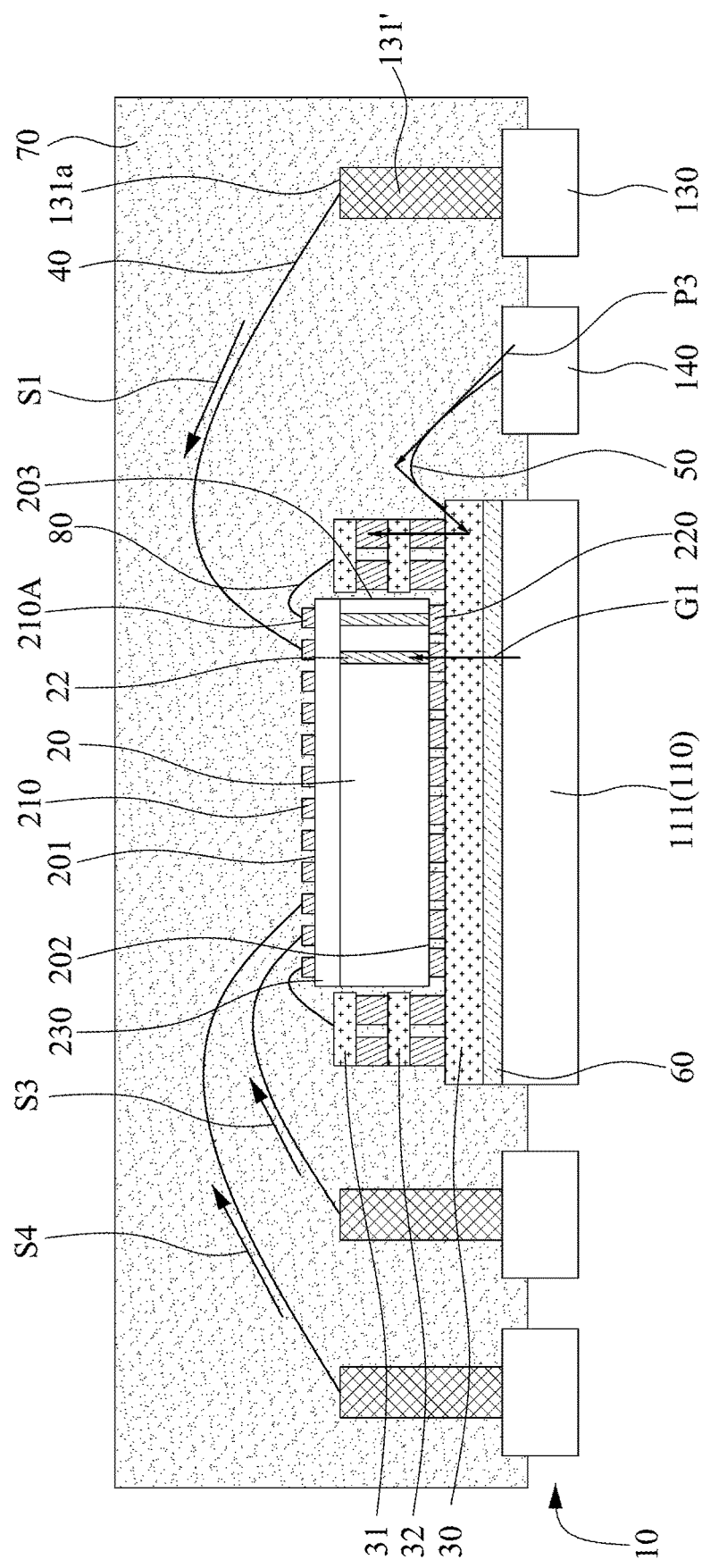
FIG. 8 is a cross-section of an electronic package in accordance with some embodiments of the present disclosure.

FIG. 8 is a cross-section of an electronic package 8 in accordance with some embodiments of the present disclosure. The electronic package 8 is similar to the electronic package 7A in FIG. 7A, with differences therebetween as follows. Descriptions of similar components are omitted.

In some embodiments, the patterned part 130 further includes an extending portion 131' extending upwards. In some embodiments, the extending portion 131' of the patterned part 130 has an upper surface 131*a* at an elevation higher than that of an upper surface (e.g., upper surfaces 111*a* and/or 112*a*) of the patterned part 110. In some embodiments, the extending portion 131' is or includes a conductive post or pillar formed on a pad.

In some embodiments, the portions 111 and 112 of the patterned part 110 of the leadframe 10 of any one of the electronic packages 3, 4, 5, 6B, and 7B illustrated in FIGS. 3, 4, 5, 6B, and 7B may include the structure of the portions 111 and 112 illustrated in any one of FIGS. 2A-21.

Figure 9A:
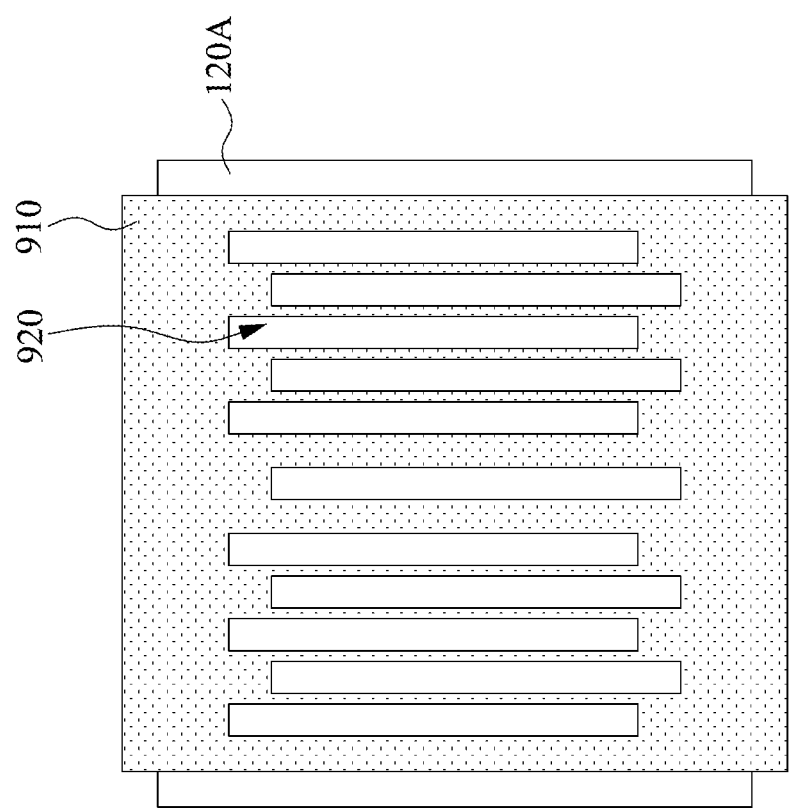
FIG. 9A, FIG. 9B, and FIG. 9C illustrate various stages of a method of manufacturing a patterned part of an electronic package in accordance with some embodiments of the present disclosure.
Figure 9B:
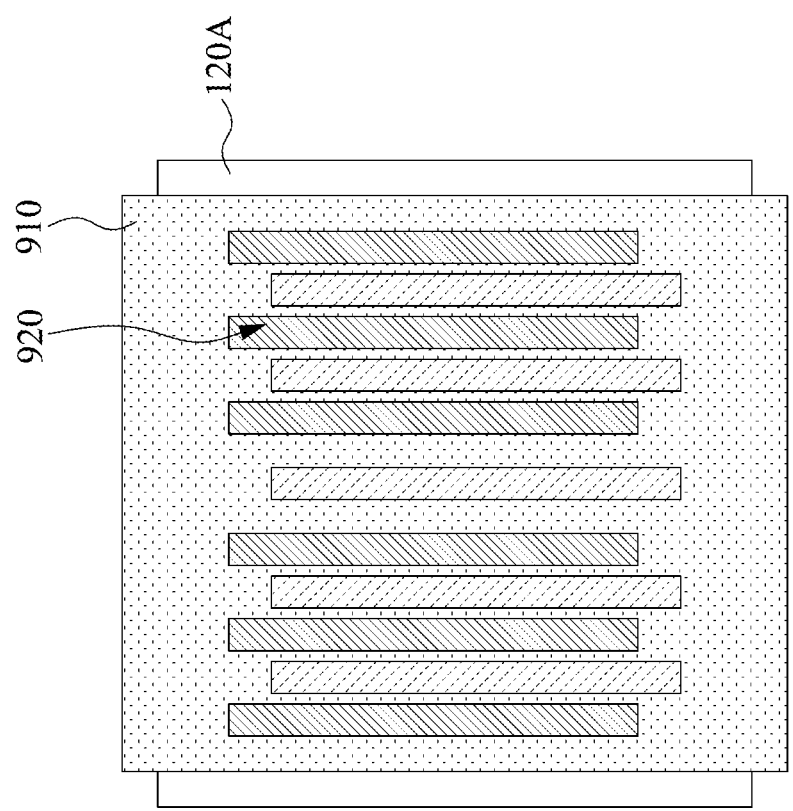
Figure 9C:
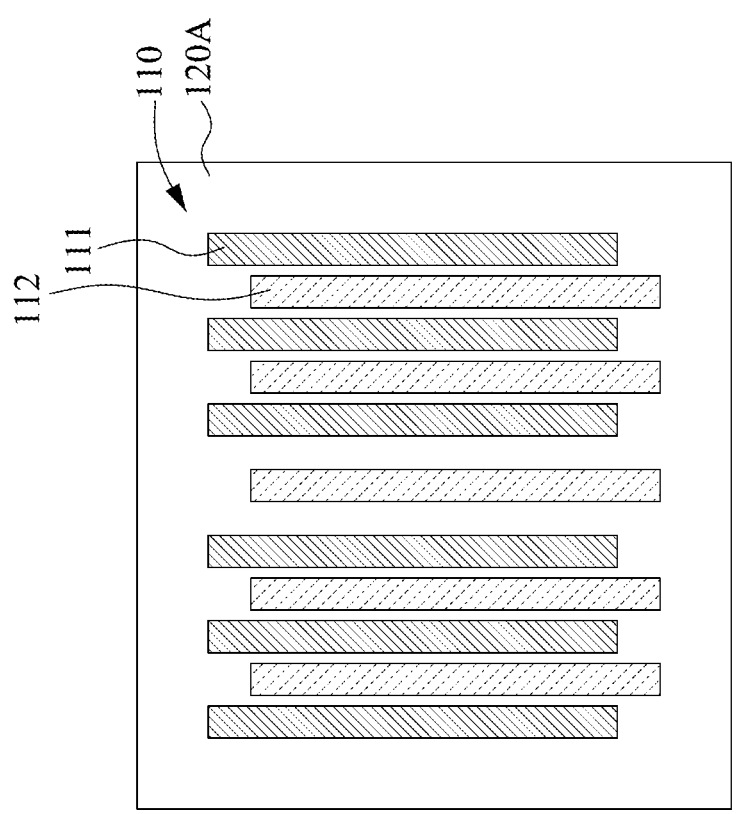

FIG. 9A, FIG. 9B, and FIG. 9C illustrate various stages of a method of manufacturing a patterned part 110 of an electronic package in accordance with some embodiments of the present disclosure.

Referring to FIG. 9A, a patterned mask 910 including a plurality of openings 920 may be disposed over a patterned part 120A. In some embodiments, the openings 920 may be directly above predetermined locations of portions to be formed on the patterned part 120A. In some embodiments, the patterned mask 910 may be a stencil mask. In some embodiments, the openings 920 may be apertures of a stencil mask.

Referring to FIG. 9B, a conductive material may be filled in the openings 920 of the patterned mask 910. In some embodiments, the conductive material may include a conductive paste including, for example, silver paste, solder paste, or the like. In some embodiments, the conductive material may be filled in the openings 920 by a printing process. For example, a squeegee may be used to move along a top surface of the patterned mask 910 (or the stencil mask) to press and fill the conductive material in the openings 920 (or the apertures). As such, the conductive material is formed on the predetermined locations on the patterned part 120A where the portions 111 and 112 are formed subsequently.

Referring to FIG. 9C, the patterned mask 910 may be removed. In some embodiments, a curing operation may be performed on the conductive material formed on the predetermined locations on the patterned part 120A to form the portions 111 and 112. The curing operation may include a reflow process. As such, the patterned part 110 including the portions 111 and 112 is formed on the patterned part 120A.

Figure 10A:
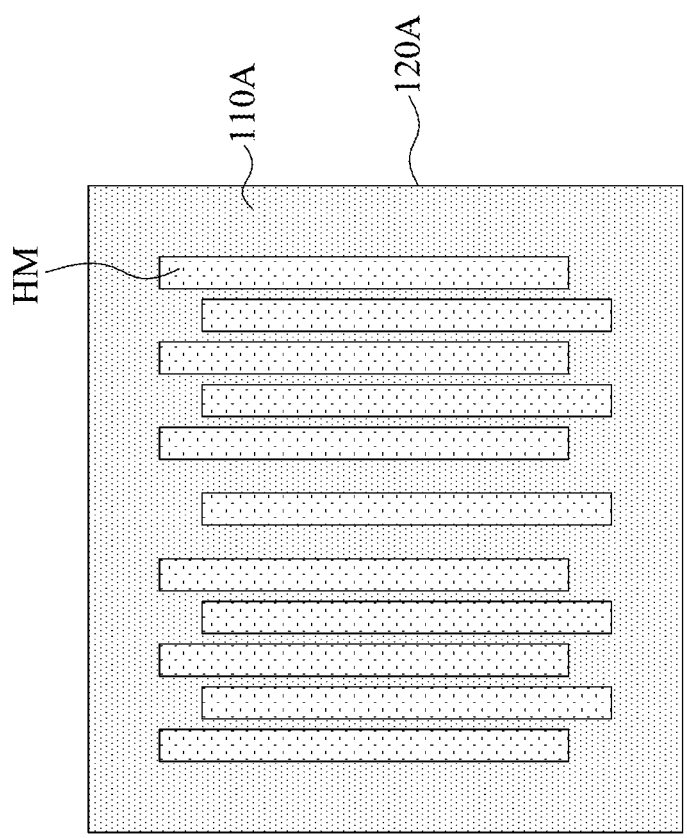
FIG. 10A, FIG. 10B, and FIG. 10C illustrate various stages of a method of manufacturing a patterned part of an electronic package in accordance with some embodiments of the present disclosure.
Figure 10B:
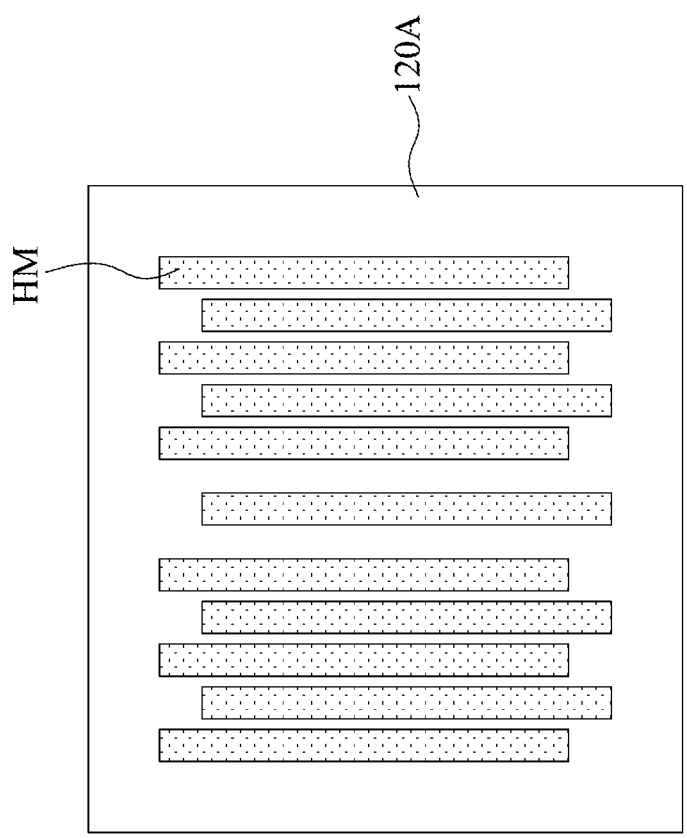
Figure 10C:
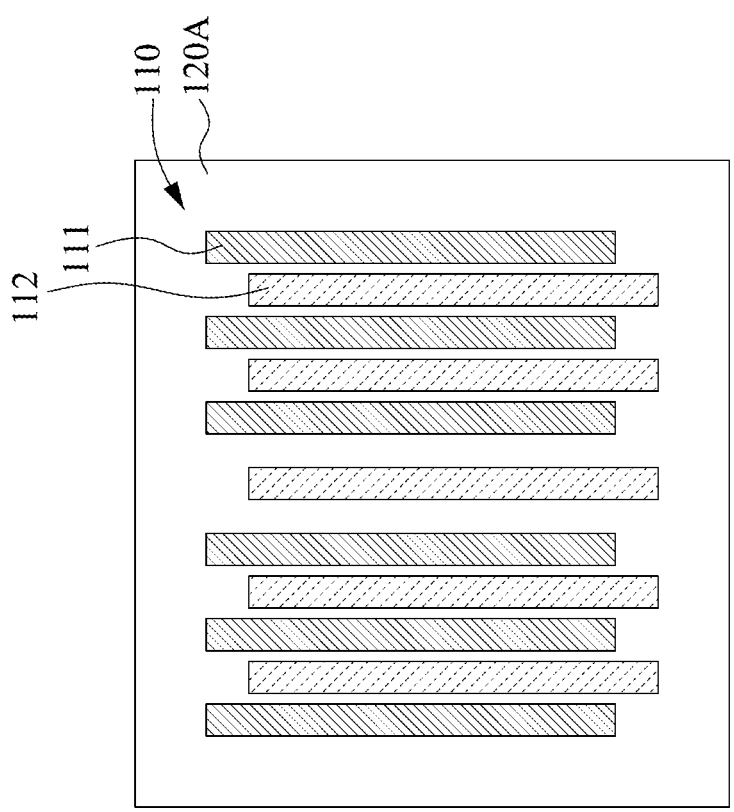

FIG. 10A, FIG. 10B, and FIG. 10C illustrate various stages of a method of manufacturing a patterned part 110 of an electronic package in accordance with some embodiments of the present disclosure.

Referring to FIG. 10A, a conductive material 110A may be formed on the patterned part 120A, and a patterned mask layer HM may be formed on the conductive material 110A. In some embodiments, the conductive material 110A may be formed by plating, deposition, or the like. In some embodiments, the patterned mask layer HM may be formed by a lithographic technique.

Referring to FIG. 10B, a portion of the conductive material 110A may be removed according to the patterned mask layer HM. In some embodiments, an etching operation may be performed on the conductive material 110A according to the patterned mask layer HM. In some embodiments, portions of the conductive material 110A exposed by the patterned mask layer HM are removed by etching.

Referring to FIG. 10C, the patterned mask layer HM may be removed. As such, the patterned part 110 including the portions 111 and 112 is formed on the patterned part 120A.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of said numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component. In the description of some embodiments, a component provided "under" or "below" another component can encompass cases where the former component is directly below (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and the like. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. An electronic package, comprising:
   an electronic component having a first surface and a second surface;
   a leadframe disposed below the electronic component, wherein the leadframe is configured to provide a first power path to the first surface of the electronic component and a second power path to the second surface of the electronic component, wherein the first power path partially non-overlaps the electronic component; and a protective element encapsulating the electronic component, wherein the leadframe includes an extending part having a vertical portion and a horizontal portion, and wherein the vertical portion extends toward a top surface of the protective element and the horizontal portion extends toward the electronic component, wherein a top surface of the horizontal portion is substantially parallel with the first surface of the electronic component.

2. The electronic package of claim 1, wherein the leadframe is configured to provide two different power voltages in the first power path and the second power path.

3. The electronic package of claim 1, further comprising a bonding wire electrically connecting the horizontal portion and the electronic component, wherein an elevation of the bonding wire is higher than or identical to that of the top surface of the horizontal portion and the first surface of the electronic component.

4. The electronic package of claim 1, further comprising a power regulating component disposed between the electronic component and the leadframe, wherein the vertical portion laterally overlaps the power regulating component.

5. An electronic package, comprising:
an electronic component having a first surface and a second surface;
a leadframe disposed below the electronic component, wherein the leadframe is configured to provide a first power path to the first surface of the electronic component and a second power path to the second surface of the electronic component, wherein the first power path partially non-overlaps the electronic component; and
a power regulating component disposed between the electronic component and the leadframe, wherein the power regulating component is configured to receive power from the leadframe through a top surface of the power regulating component.

6. The electronic package of claim 5, further comprising a passive component disposed between the power regulating component and the electronic component, wherein the passive component and the power regulating component define a space accommodating a conductive element connecting the leadframe and the power regulating component.

* * * * *